(12) United States Patent
Ramkumar

(10) Patent No.: US 11,641,745 B2
(45) Date of Patent: May 2, 2023

(54) EMBEDDED SONOS WITH A HIGH-K METAL GATE AND MANUFACTURING METHODS OF THE SAME

(71) Applicant: LONGITUDE FLASH MEMORY SOLUTIONS LTD., Dublin (IE)

(72) Inventor: Krishnaswamy Ramkumar, San Jose, CA (US)

(73) Assignee: LONGITUDE FLASH MEMORY SOLUTIONS LTD., Dublin (IE)

(*) Notice: Subject to any disclaimer, the term of this patent is extended or adjusted under 35 U.S.C. 154(b) by 0 days.

(21) Appl. No.: 16/541,765

(22) Filed: Aug. 15, 2019

(65) Prior Publication Data

US 2019/0371806 A1    Dec. 5, 2019

Related U.S. Application Data

(63) Continuation of application No. 15/820,138, filed on Nov. 21, 2017.

(60) Provisional application No. 62/568,230, filed on Oct. 4, 2017.

(51) Int. Cl.

| | | |
|---|---|---|
| H01L 27/11573 | (2017.01) | |
| H01L 21/02 | (2006.01) | |
| H01L 27/11568 | (2017.01) | |
| H01L 21/28 | (2006.01) | |
| H01L 27/1157 | (2017.01) | |
| H01L 29/423 | (2006.01) | |
| H01L 21/311 | (2006.01) | |

(52) U.S. Cl.
CPC .... *H01L 27/11573* (2013.01); *H01L 21/0223* (2013.01); *H01L 27/1157* (2013.01); *H01L 27/11568* (2013.01); *H01L 29/40117* (2019.08); *H01L 29/4234* (2013.01); *H01L 21/31111* (2013.01); *H01L 29/42364* (2013.01)

(58) Field of Classification Search
CPC ................................... H01L 27/11573
See application file for complete search history.

(56) References Cited

U.S. PATENT DOCUMENTS

| | | |
|---|---|---|
| 7,015,101 B2 | 3/2006 | Zheng et al. |
| 8,063,434 B1 | 11/2011 | Polishchuk et al. |
| 8,071,453 B1 | 12/2011 | Ramkumar et al. |
| (Continued) | | |

FOREIGN PATENT DOCUMENTS

| | | |
|---|---|---|
| JP | 2012186349 A | 9/2012 |
| JP | 2013507001 A | 2/2013 |
| JP | 2013051418 A | 3/2013 |

*Primary Examiner* — Jarrett J Stark
(74) *Attorney, Agent, or Firm* — Kunzler Bean & Adamson

(57) ABSTRACT

Semiconductor devices and methods of manufacturing the same are provided. The semiconductor devices may have a non-volatile memory (NVM) transistor including a charge-trapping layer and a blocking dielectric, a field-effect transistor (FET) of a first type including a first gate dielectric having a first thickness, a FET of a second type including a second gate dielectric having a second thickness, and a FET of a third type including a third gate dielectric having a third thickness. In some embodiments, the first, second, and third gate dielectric includes a high dielectric constant (high-K) dielectric layer, and the first thickness is greater than the second thickness, the second thickness is greater than the third thickness. Other embodiments are also described.

22 Claims, 28 Drawing Sheets

(56) References Cited

U.S. PATENT DOCUMENTS

| | | |
|---|---|---|
| 8,409,950 B1 | 4/2013 | Shea et al. |
| 8,883,624 B1 * | 11/2014 | Ramkumar ......... H01L 29/4966 |
| | | 438/587 |
| 9,082,837 B2 | 7/2015 | Perera |
| 9,218,978 B1 | 12/2015 | Ramkumar |
| 9,275,864 B2 | 3/2016 | Perera et al. |
| 9,299,568 B2 | 3/2016 | Jenne et al. |
| 9,590,118 B1 | 3/2017 | Smith et al. |
| 9,721,962 B1 | 8/2017 | Ramkumar |
| 2013/0175604 A1 * | 7/2013 | Polishchuk ......... H01L 29/7926 |
| | | 257/325 |
| 2015/0060983 A1 * | 3/2015 | Lusetsky ............. H01L 29/4234 |
| | | 257/316 |
| 2016/0099253 A1 | 4/2016 | Ramkumar |
| 2016/0204120 A1 | 7/2016 | Prabhakar et al. |
| 2017/0092371 A1 | 3/2017 | Harari |
| 2017/0194334 A1 | 7/2017 | Wu et al. |
| 2017/0194344 A1 | 7/2017 | Wu et al. |

* cited by examiner

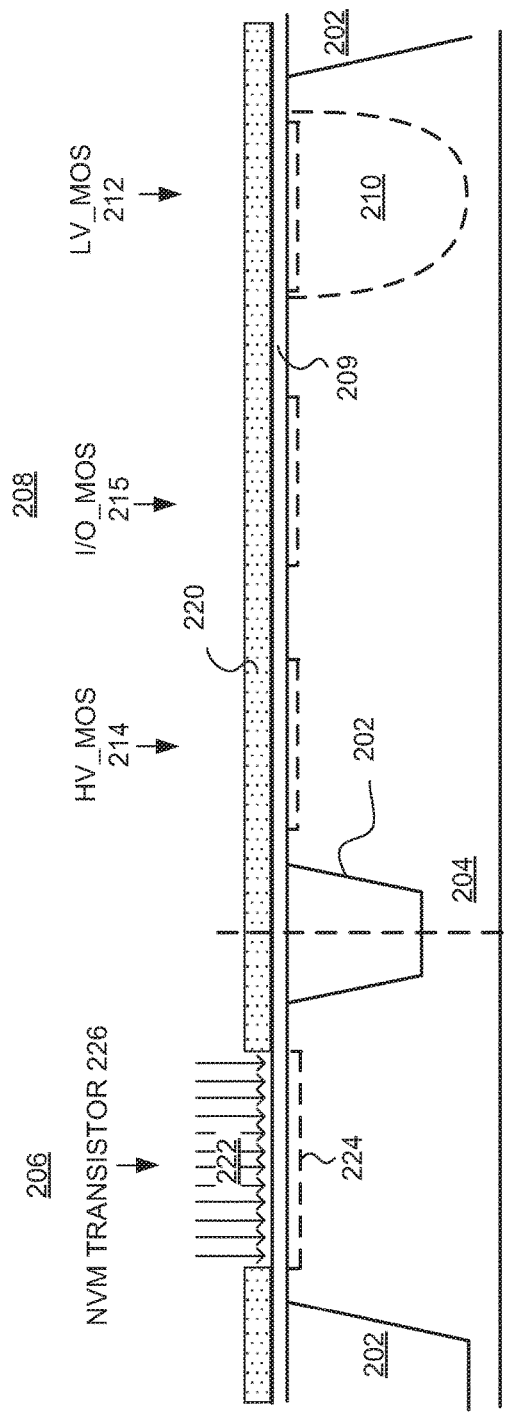
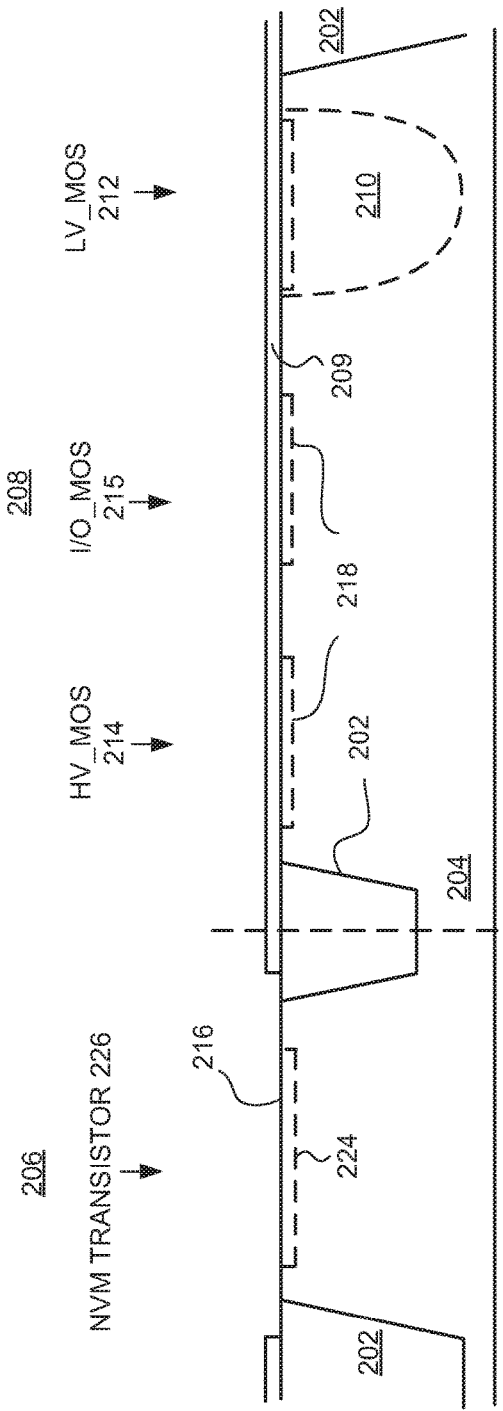
FIG. 2C
FIG. 2D

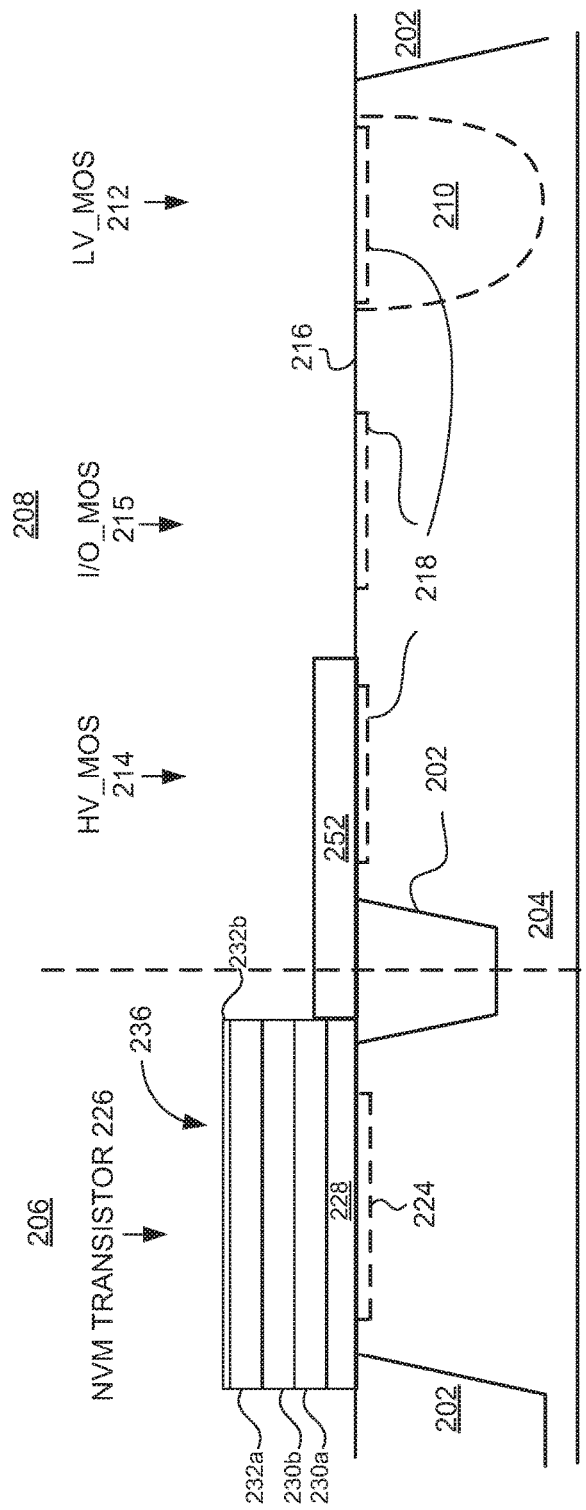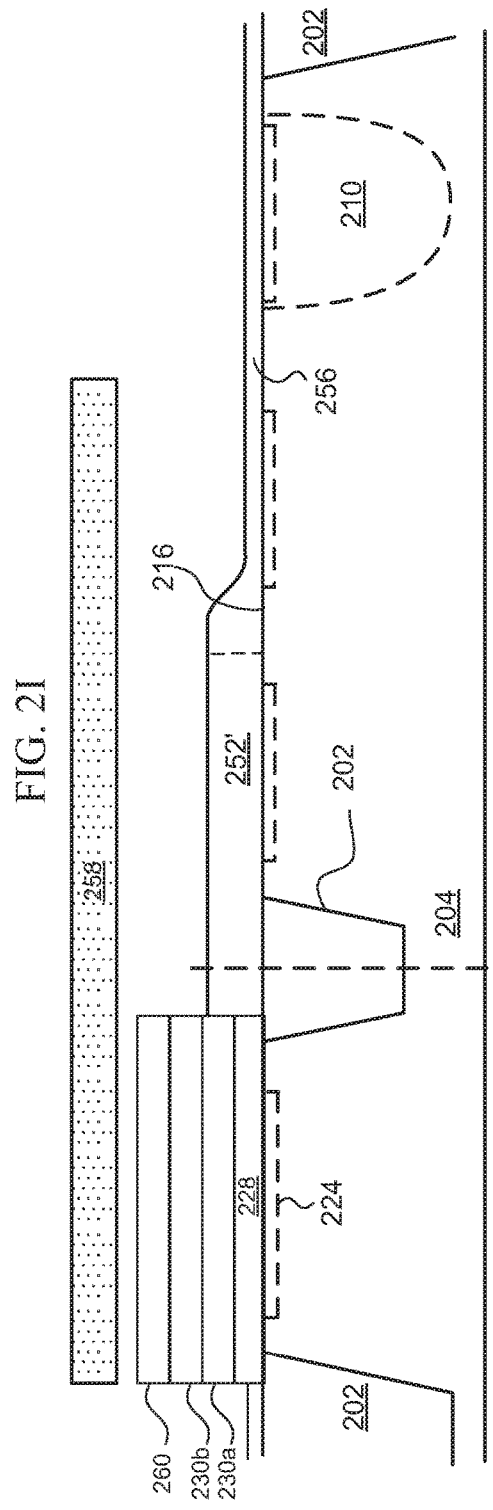
FIG. 2I
FIG. 2J

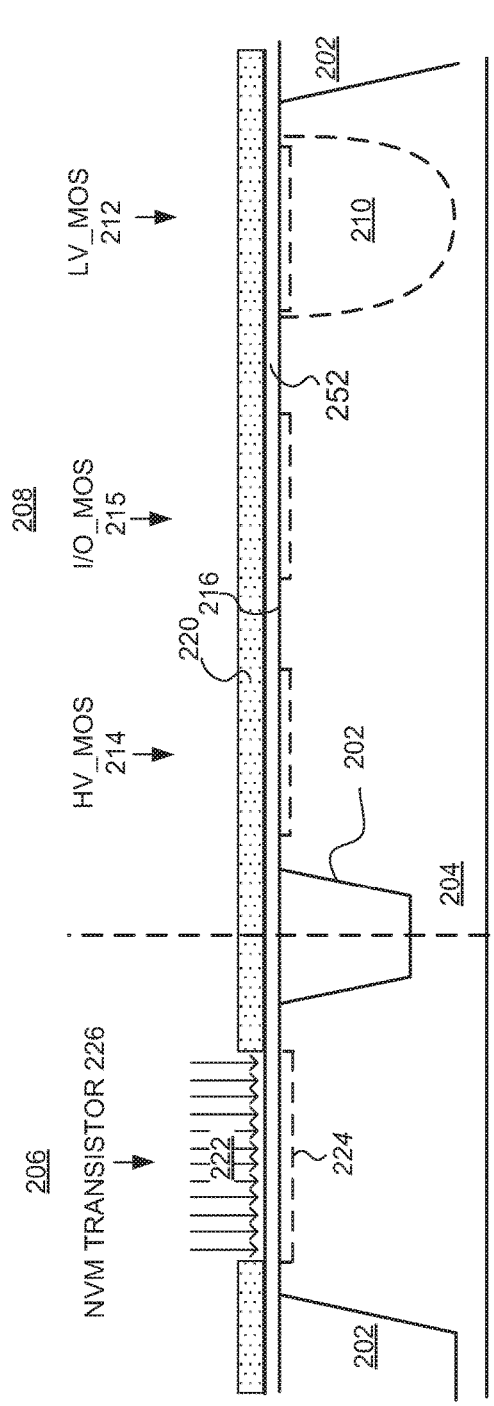
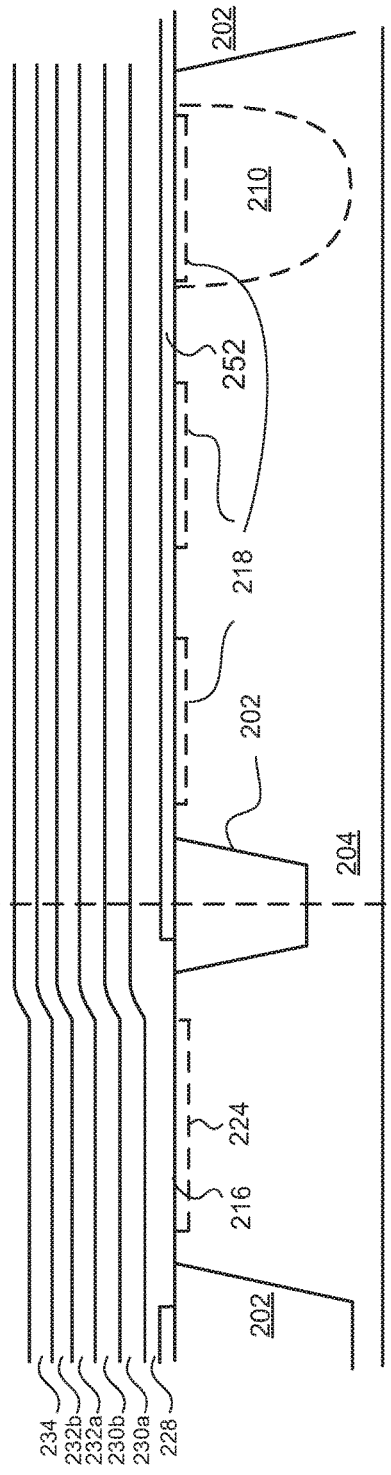
FIG. 6C
FIG. 6D

EMBEDDED SONOS WITH A HIGH-K METAL GATE AND MANUFACTURING METHODS OF THE SAME

PRIORITY

The present application is a continuation of U.S. application Ser. No. 15/820,138 filed Nov. 21, 2017, which claims the priority and benefit under 35 U.S.C. § 119(e) of U.S. Provisional Application No. 62/568,230, filed on Oct. 4, 2017, all of which are incorporated by reference herein in their entirety.

TECHNICAL FIELD

The present disclosure relates generally to semiconductor devices, and more particularly to memory cells and methods of manufacturing thereof including an embedded or integrally formed charge-trapping gate stack having a high-K or hi-K dielectric and a metal gate into an existing complementary metal-oxide-semiconductor (CMOS) foundry logic technology.

BACKGROUND

For many applications, such as system-on-chip, it may be desirable to integrate logic devices and interface circuits based upon metal-oxide-semiconductor field-effect transistors (MOSFET or MOS) and non-volatile memory (NVM) transistors on a single integrated circuit package, a single chip or a single substrate. This integration, in some embodiments, may seriously impact both the MOS transistor and NVM transistor fabrication processes. MOS transistors are typically fabricated using a standard or baseline complementary-metal-oxide-semiconductor (CMOS) process flow, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include NVM transistors, such as silicon-oxide-nitride-oxide-silicon or semiconductor-oxide-nitride-oxide-semiconductor (SONOS) based transistors, including charge-trapping gate stacks in which a stored or trapped charge changes a threshold voltage of the NVM transistor to store information as a logic "1" or "0". Charge-trapping gate stack formation may involve the formation of a nitride or oxynitride charge-trapping layer(s) disposed between two dielectric or oxide layers. Charge-trapping gate stack is typically fabricated using materials and processes that differ significantly from those of the baseline CMOS process flow, and which may detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration may also impact the baseline CMOS process flow, and generally require a substantial number of mask sets and process steps, which add to the expense of fabricating the devices and may reduce yield of working devices.

Besides, it may be important for the integrated fabrication process to be able to control the thickness of top or blocking dielectric of NVM transistors, for example, in order to meet requirements such as desirable threshold voltages Vts and/or equivalent oxide thickness (EOT) while satisfying gate oxide thickness (physical or electrical) targets of MOS transistors, especially if those MOS transistors are high voltage (HV) or input/output (I/O) transistors.

As technology nodes are getting smaller, for example at 28 nm and beyond, high-K metal gate (HKMG) stacks have become more important. HKMG stacks may switch using a thin high-K dielectric additionally or alternatively to the silicon dioxide or silicon oxynitride layer and a metal gate instead of a polysilicon gate. Among other benefits, HKMG stacks may improve leakage and performances of MOS transistors, and data retention of SONOS transistors. Therefore, there are needs to incorporate SONOS into HKMG CMOS process flow. The introduction of metal gates to SONOS transistors may transform the device to metal-oxide-nitride-oxide-semiconductor (MONOS). It will be the understanding that the two terms, viz. SONOS and MONOS are used interchangeably throughout this patent document.

BRIEF DESCRIPTION OF THE DRAWINGS

The present disclosure is illustrated by way of example, and not by way of limitation, in the FIGS. of the accompanying drawings.

FIGS. 2A-2L are representative diagrams illustrating cross-sectional views of a portion of a memory cell during fabrication of the memory cell according to the method of FIG. 1;

FIGS. 6A-6E are representative diagrams illustrating cross-sectional views of a portion of a memory cell during fabrication of the memory cell according to the method of FIG. 5;

DETAILED DESCRIPTION

Figure 1:
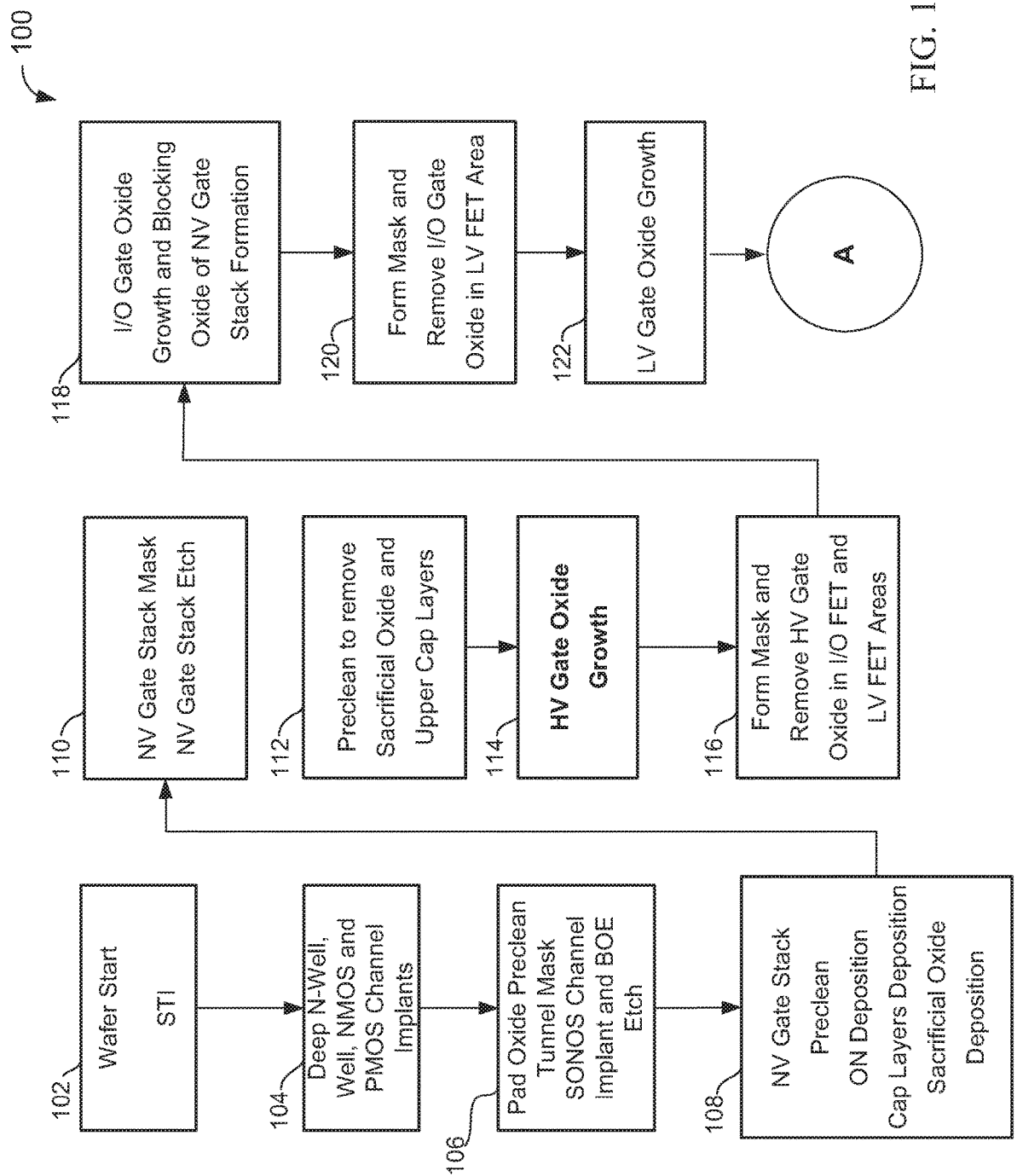
FIG. 1 is a flowchart illustrating an embodiment of a method for fabricating a memory cell or array including an embedded SONOS based NVM transistor and MOS transistors of an interim memory cell illustrated in FIG. 2L.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cell including an embedded non-volatile memory (NVM) transistor and metal-oxide-semiconductor (MOS) transistors having a high-K metal gate (HKMG) stack, and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The NVM transistor may include memory transistors or devices implemented related to Silicon-Oxide-Nitride-Oxide-Silicon (SONOS), Metal-Oxide-Nitride-Oxide-Silicon (MONOS) or floating gate technology. An embodiment of a method for integrating or embedding a NVM transistor into a standard or baseline CMOS process flow for fabricating one or more MOS transistors, which may include triple gates and/or high-K metal gates (HKMGs), will now be described in detail with reference to FIGS. 1 through 8I. FIGS. 1, 3, 5, and 7 are flowcharts illustrating embodiments of a method or process flow for fabricating the memory cell or array in various stages and alternative methods. FIGS. 2A-2L, 4A-4D, 6A-6E, and 8A-8I are block diagrams illustrating cross-sectional views of a portion of a memory cell during fabrication of the memory cell according to the method of FIGS. 1, 3, 5, and 7, respectively. FIG. 8J is a representative diagram illustrating a cross-sectional view of a portion of an embodiment of the finished memory cell or array.

SUMMARY OF SUBJECT MATTER

According to one embodiment, a semiconductor device disclosed herein may include a non-volatile memory (NVM) transistor including a charge-trapping layer and a blocking dielectric, a field-effect transistor (FET) of a first type including a first gate dielectric having a first thickness, a FET of a second type including a second gate dielectric having a second thickness, and a FET of a third type including a third gate dielectric having a third thickness. In one embodiment, each of the first, second, and third gate dielectric may include a high dielectric constant (high-K) dielectric layer. The first thickness is greater than the second thickness, and the second thickness is greater than the third thickness.

In one embodiment, the FET of the first type may be a high voltage metal-oxide-semiconductor (HV_MOS) transistor, the FET of the second type may be an input/output metal-oxide-semiconductor (I/O_MOS) transistor, and the FET of the third type may be a low voltage metal-oxide-semiconductor (LV_MOS) transistor.

In one embodiment, the blocking dielectric of the NVM transistor may include the high-K dielectric layer disposed overlying a blocking oxide.

In one embodiment, the NVM transistor may be disposed in a first region and the FETs of the first, second, and third types in a second region, in which the first and second regions are both disposed in one single semiconductor die.

In one embodiment, the first, second, and third gate dielectric may further include respectively first, second, and third gate oxide disposed underneath the high-K dielectric layer, in which the first gate oxide is thicker than the second gate oxide, the second gate oxide is thicker than the third gate oxide.

In one embodiment, a multilayer metal gate may be disposed overlying each of the first, second, and third gate dielectric, in which the multilayer metal gate may include a thick metal layer disposed over a gate metal layer.

In one embodiment, a multilayer metal gate may be disposed overlying the blocking dielectric of the NVM transistor, in which the multilayer metal gate may include a thick metal layer disposed over a gate metal layer. In another embodiment, the NVM transistor may have a polysilicon gate disposed overlying the blocking dielectric.

In certain embodiments, when the FET of the first, second, or third type is of n-channel type, the gate metal layer therein may include low work function metal. The low work function metal includes at least one of titanium, lanthanum, aluminum, and compounds or alloys thereof.

In certain embodiments, when the FET of the first, second, or third type is of p-channel type, the gate metal layer therein may include high work function metal. The high work function metal includes at least one of aluminum, titanium, and compounds or alloys thereof.

In some embodiments, the NVM transistor is a metal-oxide-nitride-oxide-semiconductor (MONOS) transistor. When the MONOS transistor is of n-channel type, the gate metal layer therein may include high work function metal. The high work function metal includes at least one of aluminum, titanium, and compounds or alloys thereof. In other embodiments, when the MONOS transistor is of n-channel type, the gate metal layer therein may include low work function metal. In other embodiments, when the MONOS transistor is of p-channel type, the gate metal layer therein may include high work function metal.

In one embodiment, the first thickness of the first gate dielectric in the HV_MOS transistor is in an approximate range of 110 Å to 160 Å, and the HV_MOS transistor is configured to operate in a voltage range of 4.5 V to 12 V for at least program or erase operations of the NVM transistor.

In one embodiment, the charge-trapping layer may have a first charge-trapping layer that is oxygen-rich, a second (top) charge-trapping layer disposed over the first (bottom) charge-trapping layer that is silicon-rich and oxygen-lean relative to the first charge-trapping layer, and an anti-tunneling oxide layer disposed between the first and second charge-trapping layers. The second charge-trapping layer may have a majority of charge traps in the charge-trapping layer.

According to another embodiment, a memory device disclosed herein may have a substrate disposed within a single semiconductor die, a plurality of non-volatile memory (NVM) transistors formed in a first region of the substrate, and a plurality of metal-oxide-semiconductor (MOS) transistors formed in a second region of the substrate. The plurality of MOS transistors may include a high voltage (HV) MOS transistor, an input/output (I/O) MOS transistor, and a low voltage (LV) MOS transistor, and a gate dielectric layer of the HV MOS, I/O MOS, and LV MOS transistors may each have a distinctively different thickness from one another, and each may include a first high dielectric constant (high-K) dielectric layer overlying a gate oxide. In some embodiments, a first gate metal layer may be disposed overlying the first gate dielectric layers of the HV MOS, I/O MOS, and LV MOS transistors.

According to another embodiment of subject matter, a system disclosed herein may include a system-on-chip (SOC) device, a plurality of logic devices, and an embedded non-volatile memory (NVM) device disposed within one single semiconductor die. In one embodiment, the embedded NVM device may include a plurality of metal-oxide-nitride-oxide-semiconductor (MONOS) transistors, in which at least one MONOS transistor includes a first metal gate layer overlying a first high dielectric constant (high-K) dielectric layer, and the SOC device and the plurality of logic devices may include high voltage (HV) metal-oxide-semiconductor (MOS) transistors, input/output (I/O) MOS transistors, and low voltage (LV) MOS transistors, in which the gate dielectric of each of the HV MOS, I/O MOS, and LV MOS transistors includes a second high-K dielectric layer, and wherein the gate dielectric of the HV MOS transistors are thicker than the gate dielectric of the I/O MOS transistors, and the gate dielectric of the I/O MOS transistors are thicker than the gate dielectric of the LV MOS transistors.

In some embodiments of application, such as SOC, microprocessors, smartcard applications, NVM transistors are embedded into MOS transistors including I/O or HV_MOS transistors or field-effect transistors (FETs) in which a thick gate oxide, oxynitride, or dielectric is required. For instance, in one embodiment, one of the MOS transistors may be a HV transistor and thus requires a thick gate oxide having an approximate thickness of up to 100 Å to 200 Å. In some process flows, HV_MOS gate oxide and NVM blocking oxide are formed concurrently. While the HV_MOS gate oxide may be formed/grown to its required thickness, since blocking or top oxide of the NVM transistor is subjected to the same environment during oxidation of the gate oxide of HV_MOS transistor(s), it may be grown to be too thick. As a result, the NVM transistor may not meet the requirements for EOT and program/erase Vts.

In this disclosure, a process to embed an Oxide-Nitride-Oxide (ONO) or ONONO charge trapping stack with single-layer or bi-layer nitride into a CMOS process that includes HKMGs and/or a thick gate oxide for its HV and I/O devices is introduced and described. In some embodiments, the aforementioned ONO stack formation sequence may not be appropriate for CMOS process flows, especially when HKMG process flow is included, that includes fabrication of thick gate oxide layers for some of the HV or I/O_MOS transistors. In such a process flow, in-situ steam generation (ISSG) or radical oxidation process may not be ideal for the gate oxidation for both top or blocking oxide layer of the NVM transistors and gate oxide layer for the HV or I/O_MOS transistors. In order to achieve the targeted thickness of gate oxide of HV or I/O_MOS transistors, top oxide grown on the ONO stack may be exposed to the ISSG process for too long and end up being too thick. Alternatively, gate oxides of the HV or I/O_MOS transistors may be grown by either a furnace process or a rapid thermal oxidation (RTO) process. In those embodiments, the furnace process or RTO process may effect moisture from isolation structures, such as shallow trench isolation (STI) dielectric, to diffuse to the ONO film, and change the thickness or uniformity of thickness of the critical tunnel oxide layer of the NVM transistors. As a result, threshold voltage of the NVM transistors may be degraded. Moreover, furnace and RTO processes are generally operated at very high temperature (up to approximately 1100° C.). The high temperature may cause changes in trap density of the nitride layer of the ONO stack, which may also degrade the threshold voltage of the NVM transistors. Additionally, when a high-K dielectric layer is added overlying or as a part of the top oxide or oxynitride of the NVM transistors, the added thickness may degrade the performance of the NVM transistors.

To address the above issues as well as other issues, the embodiments disclosed herein include processes that may enhance the retention performance of NVM transistors, such as SONOS or MONOS. At least one of the SONOS or MOS transistors may include a high-K dielectric layer and a metal gate. A Triple Gate Oxide approach is introduced that allows the use of a high voltage for programming/erasing of SONOS, which in turn makes the sensing threshold voltage (Vt) window much larger at the End-of-Life (EOL) of SONOS memory cells. At the same time, the embodiments disclosed are able to support the widely used I/O voltage of 1.6 V to 3.6 V, with the I/O MOS transistors.

Further, embodiments depicted herein may be directed to fabrication processes that ensure that the ONO stack of the NVM transistors meets the thickness and reliability requirements without degradation of the ONO stack performance, due to the HKMG process flow and thick gate layer oxidation of the HV and/or I/O_MOS transistors in an embedded system.

Figure 2A:
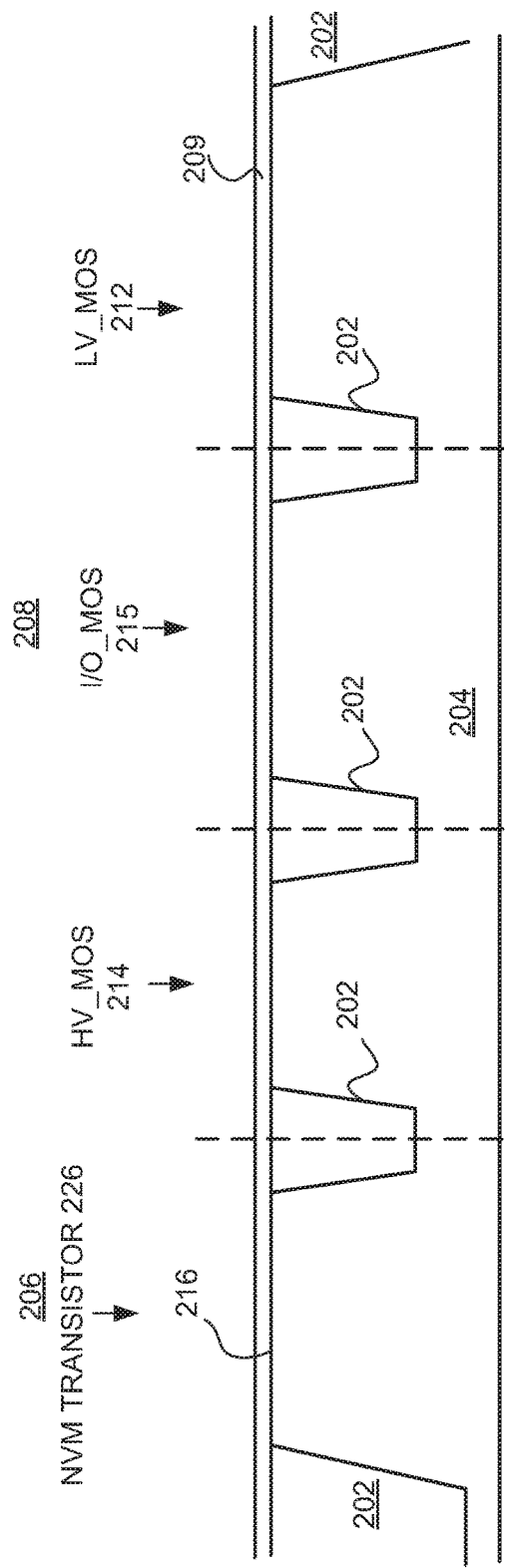

Referring to FIG. 1 and FIG. 2A, the process begins with forming a number of isolation structures or shallow trench isolation (STI) 202 in a wafer or substrate 204 (step 102). The isolation structures 202 isolate the memory cell being formed from memory cells formed in adjoining areas (not shown) of the substrate 204. Optionally and additionally, isolation structures 202 may be incorporated to isolate the NVM transistor(s) being formed in a first region 206 of the substrate 204 from one or more of the MOS transistors including HV_MOS, I/O_MOS, and LV_MOS, being formed in a second region 208. As illustrated in FIG. 2A, isolation structures 202 may be formed to isolate HV_MOS, I/O_MOS, and LV_MOS from one another. In one embodiment, the isolation structures 202 may include a dielectric material, such as oxide or nitride, and may be formed by any conventional technique, including but not limited to STI or local oxidation of silicon (LOCOS). The substrate 204 may be a bulk substrate composed of any single crystal material suitable for semiconductor device fabrication, or may include a top epitaxial layer of a suitable material formed on a substrate. In one embodiment, suitable materials for substrate 204 include, but are not limited to, silicon, germanium, silicon-germanium or a Group III-V compound semiconductor material. In some embodiments, there may be MOS transistors, such as LV_MOS transistors 212, in the first region 206. This is because certain NVM memory arrays may include MOS transistors, e.g. a two-transistor (2T) memory array.

Optionally and in some embodiments, as best shown in FIG. 2A, pad oxide 209 may be formed over a surface 216 of the substrate 204 in both the first region 206 and the second region 208. In one embodiment, pad oxide 209 may be silicon dioxide ($SiO_2$) having a thickness of from about 10 nanometers (nm) to about 20 nm or other thicknesses and may be grown by a thermal oxidation process or in-situ steam generation (ISSG) process, or other oxidation or deposition processes known in the art. It will be the understanding that pad oxide 209 may not be necessary, or formed in some embodiments.

Figure 2B:
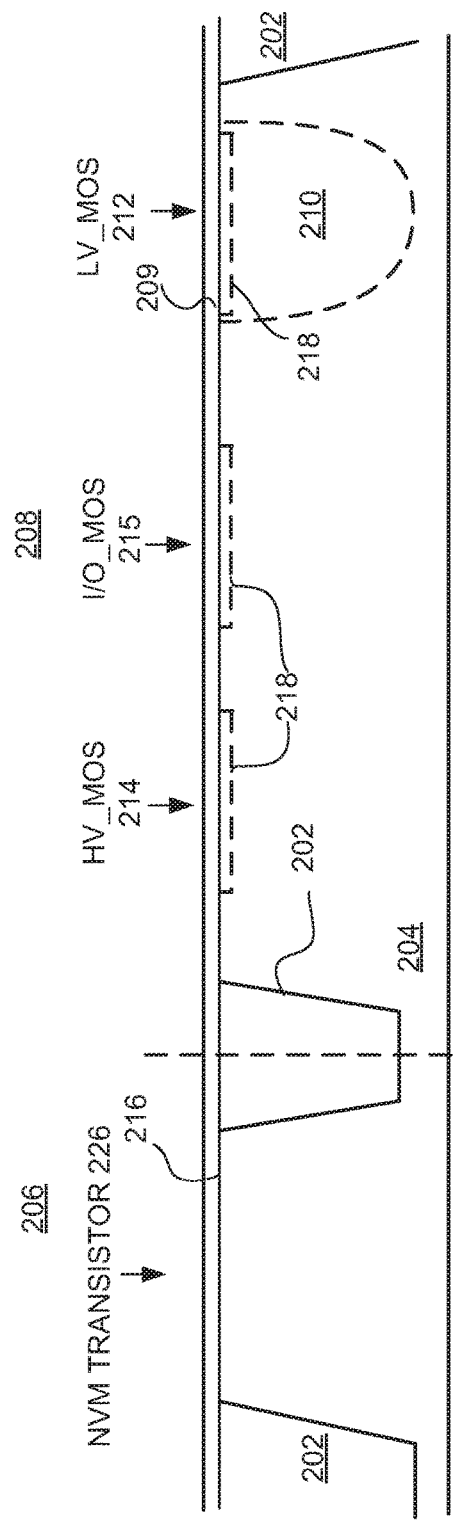

Referring to FIG. 1 and FIG. 2B, dopants are then implanted into substrate 204 through pad oxide 209 (if present) to form wells in which the NVM transistor(s) and/or the MOS transistors may be formed, and channels for the MOS transistors (step 104). According to system design, there may or may not be isolation structures 202 disposed between the first region 206 and the second region 208. One having ordinary skill in the art would understand that isolation structures 202 may be formed anywhere in substrate 204 as required, and shall not be limited to the ones shown in the figures. The dopants implanted may be of any type and concentration, and may be implanted at any energy, including energies necessary to form wells or deep wells for the NVM transistors and/or the MOS transistors, and to form channels for the MOS transistors. In one particular embodiment, illustrated in FIG. 2B as an example, dopants of an appropriate ion species are implanted to form a deep N-well 210 in the second region 208 over or in LV_MOS transistor 212, in which a P-type or P-channel transistor, may be formed. In other embodiments, wells or deep wells may also be formed for the NVM transistor 226 and/or HV_MOS transistor 214, and/or I/O_MOS transistor 215. It is further appreciated that the wells, such as deep N-well 210, may be formed by depositing and patterning a mask layer, such as a photoresist layer above surface 216 of substrate 204, and implanting an appropriate ion species at an appropriate energy to an appropriate concentration. It would be the understanding that there may be both P-type and/or N-type transistors in first region 206 and/or second region 208. The locations, quantity, and types of NVM transistor(s) 226, HV_MOS 214, I/O_MOS 215, and LV_MOS 212 illustrated in FIG. 2B and other figures are merely for illustrative purposes, and should not be construed as limitations.

In one embodiment, channels 218 for one or more of the HV, I/O, and LV_MOS transistors 214, 215, 212 may be formed in the second region 208 of substrate 204. It will be the understanding that channels 218 of HV, I/O, and LV_MOS transistors 214, 215, 212 may or may not be formed concurrently. As with the well implant, channels 218 may be formed by depositing and patterning a mask layer, such as a photoresist layer above the surface 216 of substrate 204, and implanting an appropriate ion species at an appropriate energy to an appropriate concentration. In one embodiment, for example, $BF_2$ may be implanted at an energy of from about 10 kilo-electron volts (keV), to about 100 keV, and a dose of from about 1e12 $cm^{-2}$ to about 1e14 $cm^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 218, in all three of the MOS transistors 214, 212, 215 at the same time, or at separate times using standard lithographic techniques, including a patterned photoresist layer to mask one of the channels 218 for the MOS transistors 214, 212, 215.

Next, referring to FIG. 1 and FIGS. 2C and 2D, a patterned tunnel mask 220 is formed on or overlying pad oxide 209 layer, ions (represented by arrows 222) of an appropriate type, energy, and concentration are implanted through a window or opening in tunnel mask 220 to form channel 224 for NVM transistor 226 in the first region 206, and tunnel mask 220 and pad oxide 209 layer in at least the second region 208 removed (step 106). Tunnel mask 220 may include a photoresist layer, or a hard mask formed, from a patterned nitride or silicon-nitride layer. In the embodiment that multiple NVM transistors 226 are present in first region 206, multiple channels 224 may be formed concurrently, individually, or in groups.

In one embodiment, channel 224 for NVM transistor 226 may be a deep indium doped channel implanted with indium (In) at an energy of from about 50 kilo-electron volts (keV) to about 500 keV, and a dose of from about 5e11 $cm^{-2}$ to about 1e13 $cm^{-2}$ to form an N-channel NVM transistor 226. In one embodiment, implanting indium to form channel 224 of NVM transistor 226 improves the threshold voltage ($V_T$) uniformity of the finished NVM transistor from a sigma of $V_T$ from about 150 millivolts (mV) to about 70-80 mV. Optionally or additionally, a shallow doped channel is implanted with arsenic at an energy about 20 keV and a dose of from about 5e11 $cm^{-2}$ to about 1e13 $cm^{-2}$ at channel 224. Alternatively, $BF_2$ may be implanted to form an N-channel NVM transistor, or arsenic or phosphorous implanted to form a P-channel NVM transistor. In one alternative embodiment, channel 224 for NVM transistor 226 may also be formed concurrently with channels 218 of the MOS transistors 214, 212, 215. In some embodiments, channel(s) 224 of N-channel NVM transistor(s) and P-channel NVM transistor(s) may be formed concurrently, or separately.

In one embodiment, as illustrated in FIG. 2D, pad oxide 209 in the window or opening in the tunnel mask 220, or in at least most of the first region 206, may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 220 includes photoresist material may be ashed or stripped using oxygen plasma. Alternatively, hard tunnel mask 220 may be removed using a wet or dry etch process known in the art.

Figure 2E:
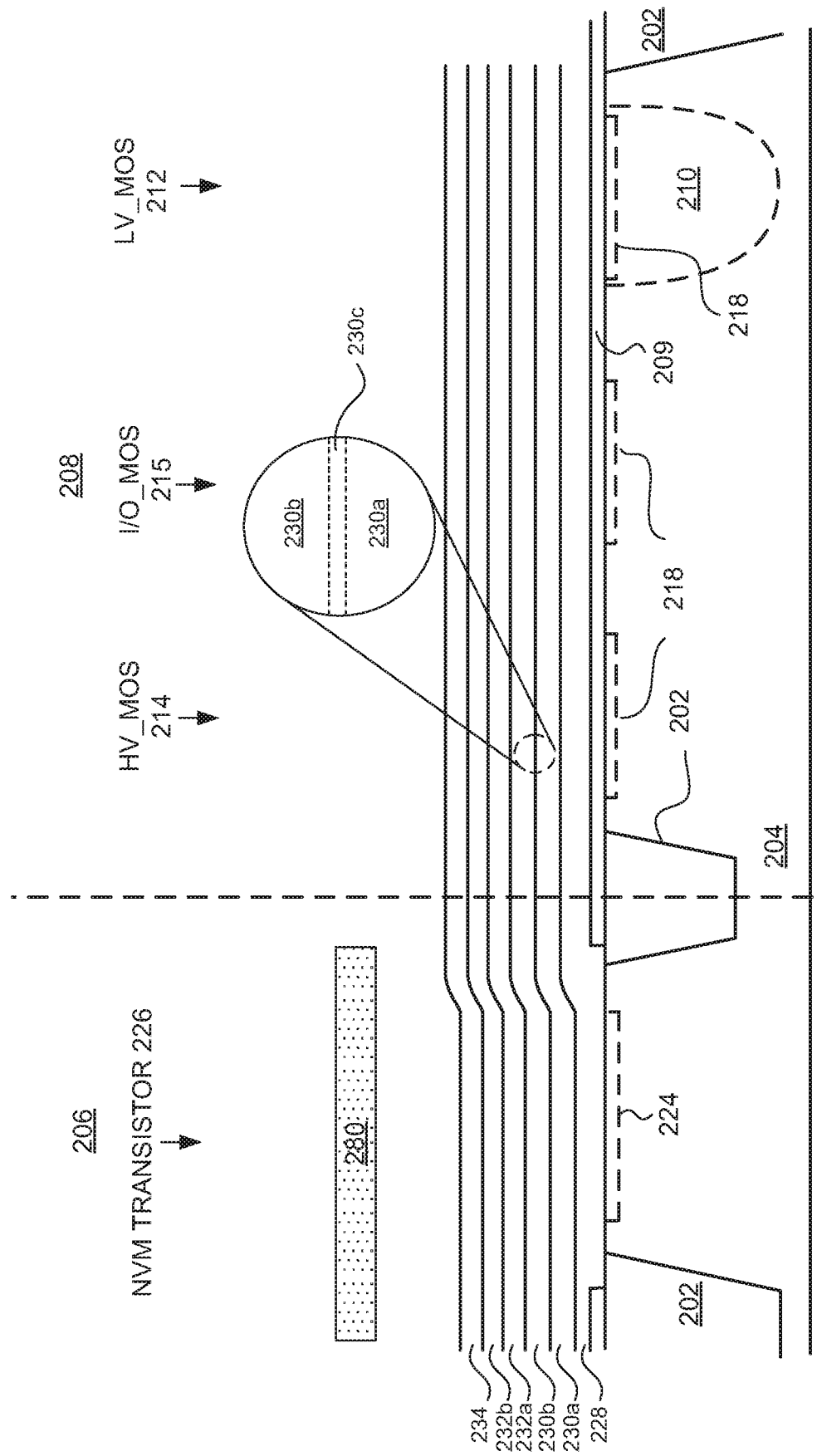
Figure 2F:
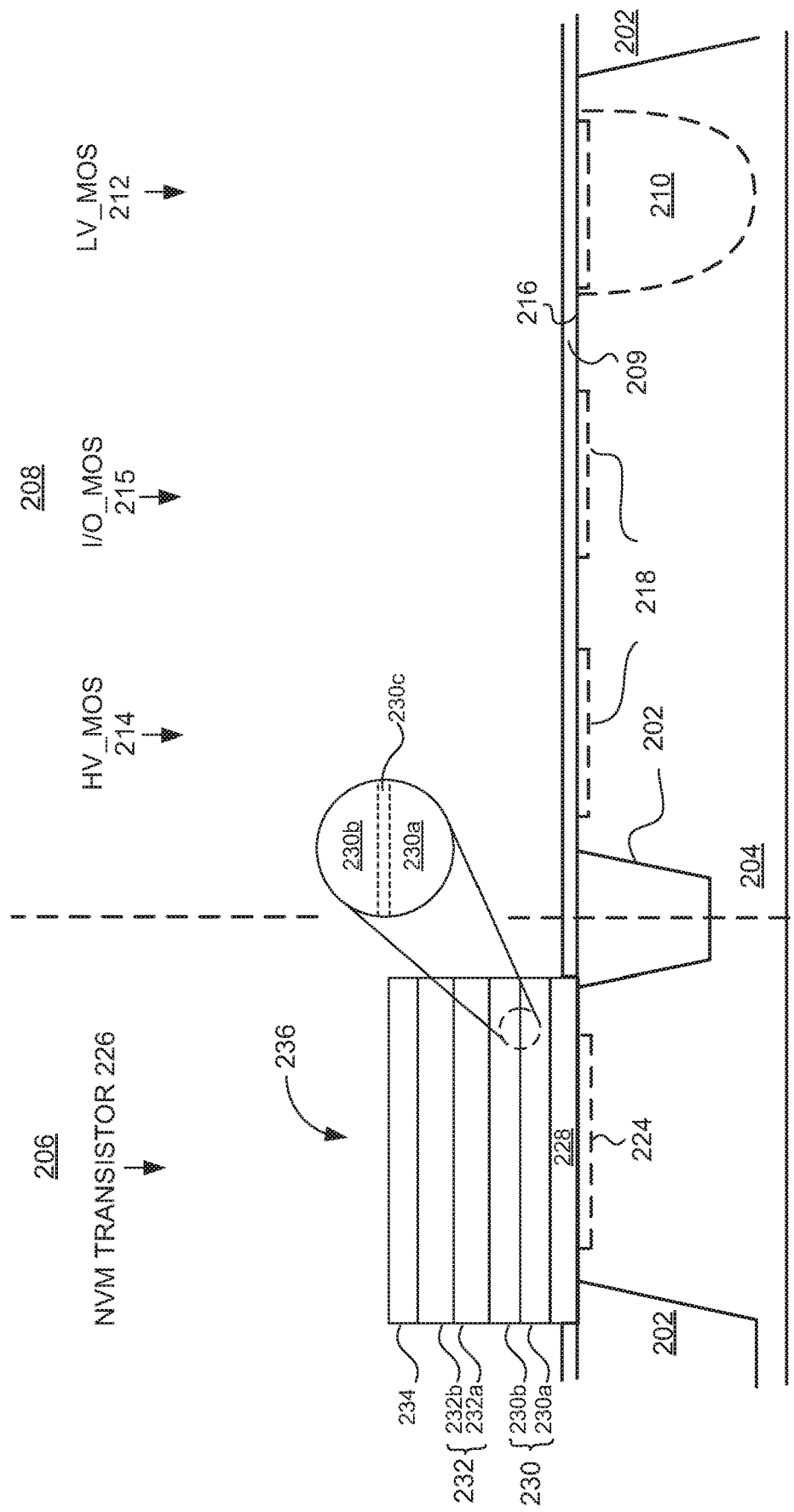

Referring to FIG. 1 and FIGS. 2E to 2F, surface 216 of substrate 204 in the first region 206 is cleaned or precleaned, a number of dielectric layers, such as oxide-nitride-oxide or ONO layers or oxide-nitride-oxide-nitride-oxide or ONONO layers, formed or deposited (step 108). Subsequently, a mask is formed on or overlying the dielectric layers, and the dielectric layers are etched to form NV gate stack 236 in first region 206 (step 110). The preclean may be a wet or dry process. In one embodiment, it may be a wet process using HF or standard cleans (SC1) and (SC2), and is highly selective to the material of substrate 204. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Referring to FIG. 2E, the dielectric or NV gate stack deposition begins with the formation of tunnel dielectric 228 over at least channel 224 of NVM transistor 226 in the first region 206 of substrate 204, and may spread over to second region 208 of substrate 204 where MOS transistors 212, 214, 215 are formed. The tunnel dielectric 228 may be any material and have any thickness suitable to allow charge carriers to tunnel into an overlying charge-trapping layer under an applied gate bias while maintaining a suitable barrier to leakage when NVM transistor 226 is unbiased. In certain embodiments, tunnel dielectric 228 may be silicon dioxide, silicon oxy-nitride, or a combination thereof and may be grown by a thermal oxidation process, using ISSG or radical oxidation.

In one embodiment a silicon dioxide tunnel dielectric 228 may be thermally grown in a thermal oxidation process. For example, a layer of silicon dioxide may be grown utilizing dry oxidation at 700° C.-800° C. in an oxygen containing gas or atmosphere, such as oxygen ($O_2$) gas. The thermal oxidation process is carried out for a duration approximately in the range of 20 to 150 minutes to effect growth of a tunnel dielectric 228 having a relatively uniform thickness of from about 1.0 nanometers (nm) to about 3.0 nm by oxidation and consumption of the exposed surface of substrate. It will be understood that such a range is merely illustrative and is not meant to be limiting.

In another embodiment, a silicon dioxide tunnel dielectric 228 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an $HO_2$ radical or an O diradical, at the surface of substrate. The radical oxidation process is carried out for a duration approximately in the approximate range of about 1 to about 10 minutes to effect growth of a tunnel dielectric 228 having a thickness of from about 1.0 nanometers (nm) to about 4.0 nm by oxidation and consumption of the exposed surface of substrate. It will be understood that in FIG. 2E and subsequent figures the thickness of tunnel dielectric 228 may be exaggerated for the purposes of clarity. In one embodiment, tunnel dielectric 228 grown in a radical oxidation process may be both denser and composed of substantially fewer hydrogen atoms per $cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 228 without impacting the throughput (substrates/hr.) requirements that a fabrication facility may require.

In another embodiment, tunnel dielectric layer 228 is deposited by chemical vapor deposition (CVD) or atomic layer deposition (ALD) and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel dielectric 228 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2E, a charge-trapping layer is formed on or overlying the tunnel dielectric 228. Generally, as best shown in FIG. 2F, the charge-trapping layer may be a multi-layer charge-trapping layer 230 comprising multiple layers including at least a lower or first charge-trapping layer 230a which is physically closer to the tunnel dielectric 228, and an upper or second charge-trapping layer 230b that is oxygen-lean relative to the first charge-trapping layer, and comprises a majority of a charge traps distributed in multi-layer charge-trapping layer 230.

The first charge-trapping layer 230a of multi-layer charge-trapping layer 230 may include a silicon nitride ($Si_3N_4$), silicon-rich silicon nitride or a silicon oxy-nitride ($SiO_xN_y$ (HO)) layer. For example, the first charge-trapping layer 230a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 230b of the multi-layer charge-trapping layer 230 is then formed, either directly or indirectly, over the first charge-trapping layer 230a. In one embodiment, the second charge-trapping layer 230b may include a silicon nitride and silicon oxy-nitride layer having a stoichiometric ratio of oxygen, nitrogen and/or silicon that is different from that of the first charge-trapping layer 230a. The second charge-trapping layer 230b may include a silicon oxynitride layer having a thickness of between about 2.0 nm and about 8.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 230a and 230b may be identical or approximately equal to one another.

In another embodiment, there may be a thin dielectric and/or oxide layer 230c formed between the first and second charge-trapping layers 230a and 230b, making the multi-layer charge trapping layer 230 an NON stack. In some embodiments, the multi-layer charge-trapping layer 230 is a split charge-trapping layer, further including a thin, middle oxide layer 230c separating the first (lower) and second (upper) charge-trapping layers 230a and 230b. The middle oxide layer 230c substantially reduces the probability of electron charge that accumulates at the boundaries of the second charge-trapping layer 230b during programming from tunneling into the first charge-trapping layer 230a, resulting in lower leakage current than for the conventional memory devices. In one embodiment, the middle oxide layer 230c may be formed by oxidizing to a chosen depth of the first charge-trapping layer 230a using thermal or radical oxidation. Radical oxidation may be performed, for example, at a temperature of 1000-1100° C. using a single substrate tool, or 800-900° C. using a batch reactor tool. A mixture of $H_2$ and $O_2$ gasses may be introduced to a process chamber at a ratio of approximately 1:1 and 10-15 Torr. using a single substrate tool, or a pressure of 300-500 Torr. for a batch process, for a time of 1-2 minutes using a single substrate tool, or 30 min to 1 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ is permitted to react at a surface of the first charge-trapping layer 230a to form radicals, such as, an OH radical, an $HO_2$ radical or an O diradical, to form the middle oxide layer 230c.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 2E, the number of dielectric layers further includes cap layer 232 formed on or overlying charge-trapping layer 230 or second charge-trapping layer 230b. In some embodiments, such as that shown, cap layer 232 is a multi-layer cap layer including at least a lower or first cap layer 232a overlying the charge-trapping layer 230, and a second cap layer 232b overlying the first cap layer 232a.

In one embodiment, first cap layer 232a may include a high-temperature-oxide (HTO), such as silicon oxide ($SiO_2$), having a thickness of between 2.0 nm and 4.0 nm deposited using a low pressure chemical vapor deposition (LPCVD) thermal oxidation process. For example, the oxidation process may include exposing the substrate 204 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 900° C. to about 1000° C. In some embodiments, the oxidation process is performed in-situ in the same process chamber as used to form second charge-trapping layer 230b, and immediately following the formation of second charge-trapping layer 230b.

In one embodiment, second cap layer 232b may include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures.

In some embodiments, first and second cap layers 232a and 232b may both include silicon nitride, a silicon-rich silicon nitride or a silicon-rich silicon oxynitride layer formed by CVD process using $N_2O/NH_3$ and $DCS/NH_3$ gas mixtures. First and second cap layers 232a and b may or may not have the same stoichiometry.

Referring still to FIGS. 1 and 2E, a sacrificial oxide layer 234 is formed on or overlying cap layer 232. In one embodiment, sacrificial oxide layer 234 may include a high-temperature-oxide (HTO) layer grown by a thermal oxidation process or radical oxidation, and having a thickness of between 2.0 nm and 4.0 nm. In another embodiment, sacrificial oxide layer 234 may be formed or deposited by a chemical vapor deposition process in a low pressure chemical vapor deposition (LPCVD) chamber. For example, sacrificial oxide layer 234 may be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer 234.

Next, still referring to FIGS. 1 and 2E, a patterned mask layer 280 is formed on or overlying the sacrificial oxide layer 234, and referring to FIG. 2F, the sacrificial oxide layer 234, cap layer 232 and charge-trapping layer 230, and tunnel dielectric layer 228 disposed outside of the first region 206 are etched or patterned to form NV gate stack 236. In one embodiment, NV gate stack 236 may be disposed substantially overlying channel 224 of NVM transistor 226 in first region 206. The etching or patterning process may further remove various dielectric layers of NV gate stack 236 from second region 208 of substrate 204 (step 110). The patterned mask layer 280 may include a photoresist layer patterned using standard lithographic techniques, and the NV gate stack 236 layers in second region 208 may be etched or removed using a dry etch process including one or more separate steps to stop on a surface of the tunnel dielectric 228 or pad oxide 209. In one embodiment, the etching may be configured to remove dielectric layers in NV gate stack in STIs 202 divot by introducing an isotropic component, and be stopped in second region 208 when a minimum of approximately 45 Å of pad oxide 209 remaining.

Figure 2G:
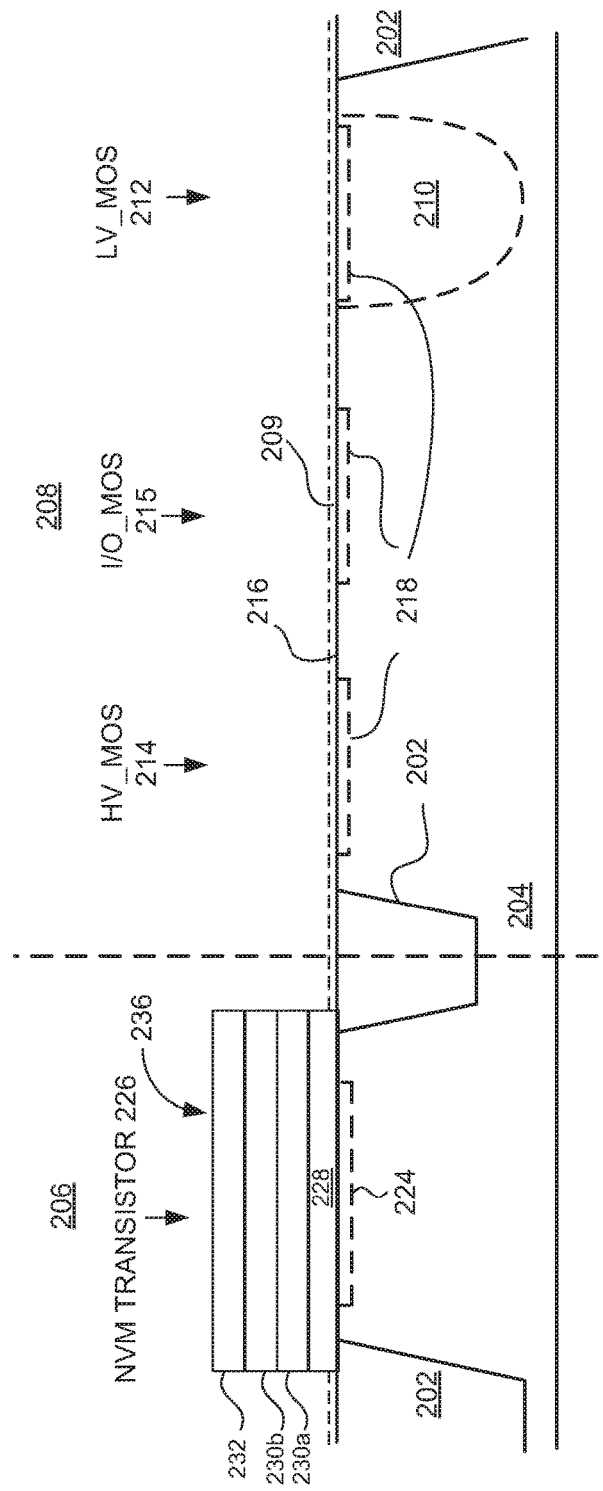

Referring to FIGS. 1, 2F, and 2G, sacrificial oxide layer 234 and a top portion or substantially all of second cap layer 232b in the multi-layer cap layer 232 are removed from NV gate stack 236 in a highly selective cleaning process (step 112). This cleaning process further removes any oxide, such as oxide in tunnel dielectric 228 and/or pad oxide 209, remaining in the first region 206 beyond NV gate stack 236, and in second region 208 to prepare substrate 204 for HV gate oxide 252 layer growth. In one alternative embodiment, pad oxide 209 may not be removed entirely or at all (dotted line in FIG. 2G). In one exemplary implementation, sacrificial oxide layer 234 and second cap layer 232b may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 2H:
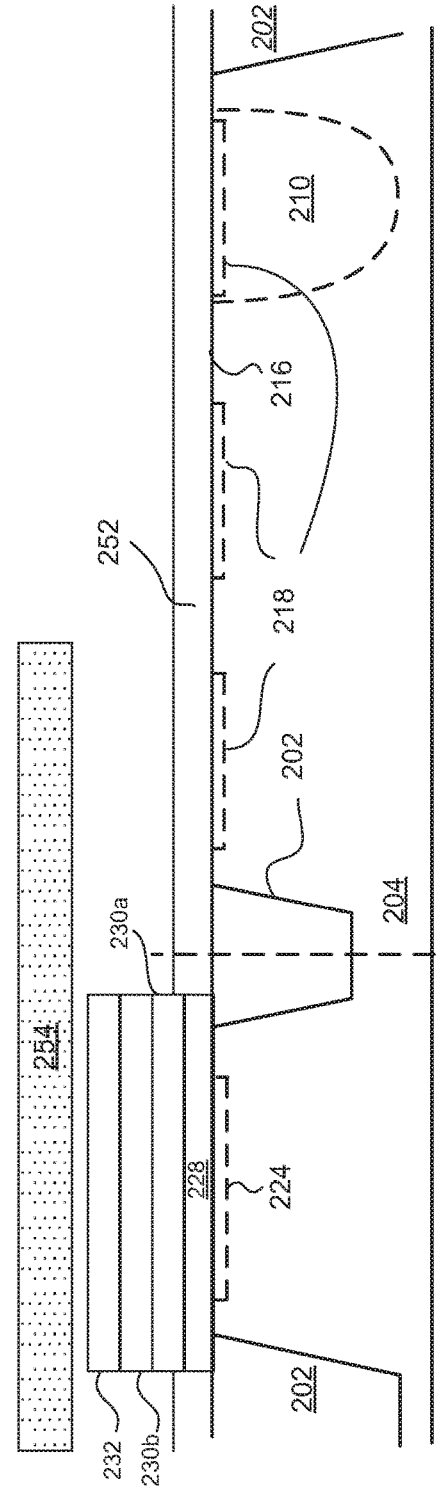

Next, referring to FIG. 1 and FIG. 2H, HV gate oxide 252 layer is formed over substrate 204 (step 114), either directly or indirectly. In one embodiment, as best illustrated in FIG. 2G, the process starts when pad oxide 209 is completely or partially removed in a pad oxide preclean process. After pad oxide 209 is removed, either partially or completely, HV gate oxide 252 layer is formed by a dry rapid thermal oxidation (RTO) process, a conventional or furnace oxidation process, a chemical vapor deposition process (CVD), or other non-radical oxide forming processes known in the art, or a combination thereof. In one embodiment, wet furnace oxidation may not be recommended, as explained in later sections.

In one embodiment, as an example, the oxidation process starts with dry RTO performed in a batch or single wafer processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form HV gate oxide 252 layer. In one embodiment, HV gate oxide 252 layer may be grown, by oxidizing silicon wafer 204, on at least a portion of the surface 216 of wafer 204. In one alternative embodiment, RTO process may be substituted with a rapid molecular oxidation which is a non-radical oxidation process. In one embodiment, HV gate oxide 252 layer however may not be formed by a wet rapid and radical oxidation process, such as in-situ steam generation (ISSG) because such radical oxidation processes may affect or oxidize cap layers 232a and/or 232b and second charge-trapping layer 230b of NV gate stack 226 in the first region 206. In alternative embodiments, RTO or conventional furnace oxidation processes may be substituted by processes such as chemical vapor deposition (CVD), or other non-radical oxidation processes performed in a batch or single wafer processing chamber with or without an ignition event such as plasma as long as oxide will be grown or deposited to form HV gate oxide 252 layer in the second region 208. In one embodiment, by controlling operation parameters in the HV gate oxide 252 layer formation, targeted thickness of HV gate oxide 252 layer may be achieved. The parameters may include time duration, temperature, pressure, reactants etc. of the RTO, furnace oxidation, and CVD processes. As will be explained in later sections, at least a portion of HV gate oxide 252 layer remains in the finished device as HV gate oxide 252 of HV_MOS transistor 214. In one embodiment, to withstand the relatively high operating voltages, desirable thickness of HV gate oxide 252 layer may be targeted to be approximately between 100 Å to 200 Å, or other thicknesses. It will be understood that such a range is merely illustrative and is not meant to be limiting. In one embodiment, HV gate oxide 252 layer may be formed, in the processes described in FIG. 2H, to be thicker than the desirable thickness. Excessive HV gate oxide 252 layer may be removed in later processes, to achieve the desirable or final thickness of HV gate oxide 252 of HV_MOS transistor 214. As previously explained, the process of forming HV gate oxide 252 layer may have very little to substantially no effect on NV gate stack 236 in the first region 206.

Referring to FIG. 2H again, after HV gate oxide 252 layer is formed, a patterned mask layer 254 may be formed on or overlying at least NV gate stack 236 in the first region 206 and HV gate oxide 252 layer over channel 218 of HV_MOS 214 in the second region 208 (step 116). The patterned mask layer 254 may include a photoresist layer patterned using standard lithographic techniques, a hard mask layer, or other techniques known in the art.

Next, referring to FIGS. 1 and 2I, HV gate oxide 252 layer overlying at least channels 218 of UO_MOS 215 and LV_MOS 212 in the second region 208 of substrate 204 is removed (step 116). After the oxide etch step, substrate surface 216 in I/O_MOS 215 and LV_MOS 212 areas may be exposed. In one exemplary embodiment, HV gate oxide 252 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, HV gate oxide 252 layer may be removed using a plasma etch process.

Next, referring to FIGS. 1 and 2J, an oxidation process is performed to oxidize the remaining portion of second cap layer 232b and/or the first cap layer 232a of multi-layer cap layer 232, and optionally, a portion of second charge-trapping layer 230b to form blocking oxide layer 260 overlying second charge-trapping layer 230b (step 118). In one embodiment, the oxidation process is adapted to oxidize or consume first cap layer 232a, or the remaining portion of second cap layer 232b, or optionally a portion of second charge-trapping layer 230b to form the blocking oxide layer 260 in the first region while simultaneously oxidizing at least a portion of substrate surface 216 overlaying channels 218 of I/O_MOS 215 and LV_MOS 212 to form I/O gate oxide 256 layer in the second region. In one embodiment, the oxidation process may also grow a layer of oxide at or around channel 218 of HV_MOS 214 to increase thickness of HV gate oxide 252' layer. The oxidation process may include in-situ-steam-generation (ISSG), or other radical oxidation processes performed in a batch or single substrate processing chamber with or without an ignition event such as plasma. For example, in one embodiment blocking oxide layer 260 and I/O gate oxide 256 layer may be grown in a radical oxidation process involving flowing hydrogen ($H_2$) and oxygen ($O_2$) gas into a processing chamber at a ratio to one another of approximately 1:1, or 10:1 for ISSG, without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C., or 800-1100° C. for ISSG, at a pressure approximately in the range of 0.5-5 Torr., or 0.5-15 Torr. for ISSG, to form radicals, such as, an OH radical, an $HO_2$ radical or an O diradical radicals at a surface of remaining second cap layer 232b or first cap layer 232a. The radical oxidation process may be carried out for a duration approximately in the range of 10-15 minutes to effect growth of blocking oxide 260 layer by oxidation and consumption of the multi-layer cap layer 232 and optionally a portion of the second charge-trapping layer 230b having a thickness of from about 3 nm to about 4.5 nm, and I/O gate oxide 256 layer having a thickness of from about 3 nm to about 7 nm. In one embodiment, by controlling operation parameters in the I/O gate oxide 256 layer formation, targeted thickness of I/O gate oxide 256 layer may be achieved. The parameters may include time duration, temperature, pressure, reactants etc. of the ISSG or other radical oxidation processes. As will be explained in later sections, at least a portion of I/O gate oxide 256 layer remains in the finished device as I/O gate oxide 256 of I/O_MOS transistor 215. In one embodiment, to withstand the relatively high operating voltage, desirable thickness of I/O gate oxide 252 layer may be targeted to be approximately between 30 Å to 70 Å, or other thicknesses. It will be understood that such a range is merely an example and is not meant to be limiting. In one embodiment, I/O gate oxide 256 layer may be formed, in the processes described in FIG. 2J, to be thicker than the desirable thickness. Excessive I/O gate oxide 256 layer may be removed in later processes, to achieve the desirable or final thickness of I/O gate oxide 256 of I/O_MOS transistor 215.

Referring to FIG. 2J again, after I/O gate oxide 256 layer is formed, a patterned mask layer 258 may be formed on or overlying at least NV gate stack 236 in the first region 206, HV gate oxide 252' layer over channel 218 of HV_MOS 214, and I/O gate oxide 256 layer over channel 218 of I/O_MOS 215 in the second region 208 (step 120). The patterned mask layer 258 may include a photoresist layer patterned using standard lithographic techniques, a hard mask layer or other techniques known in the art.

Figure 2K:
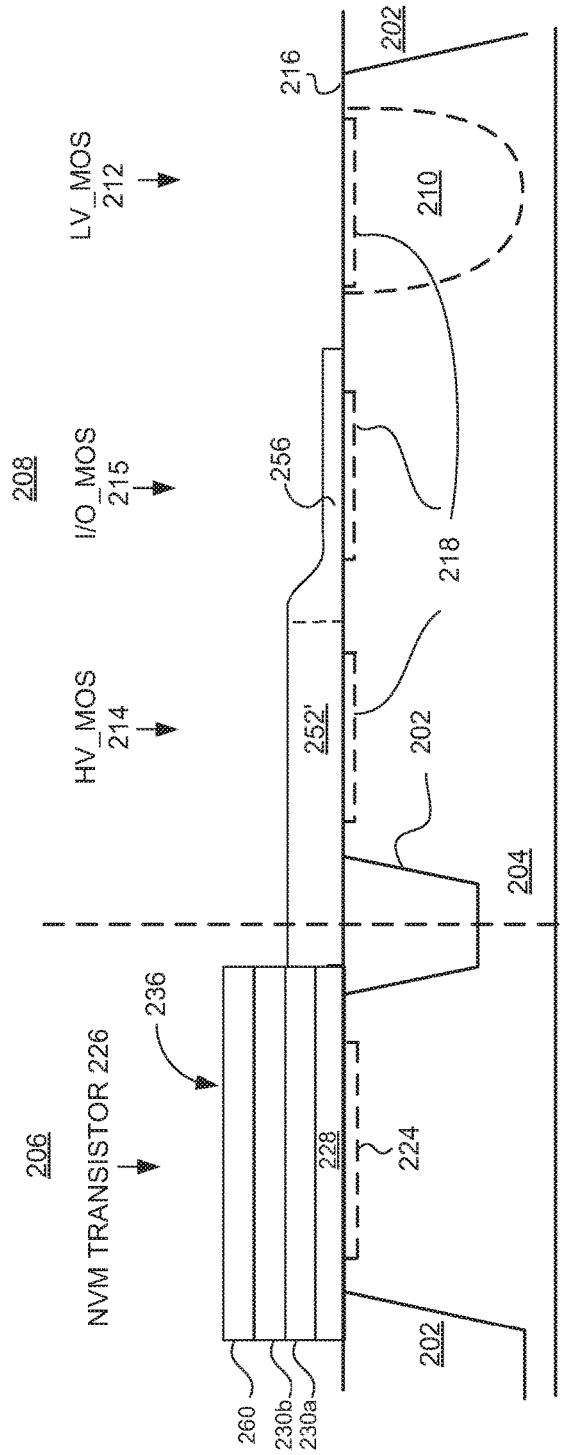

Next, referring to FIGS. 1 and 2K, I/O gate oxide 256 layer overlying at least channel 218 of LV_MOS 212 in the second region 208 of substrate 204 is removed (step 120). After the oxide etch step, substrate surface 216 in the LV_MOS 212 area may be exposed. In one exemplary embodiment, I/O gate oxide 256 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, I/O gate oxide 256 layer may be etched or removed using a dry etch process including one or more separate steps to stop on substrate surface 216.

Figure 2L:
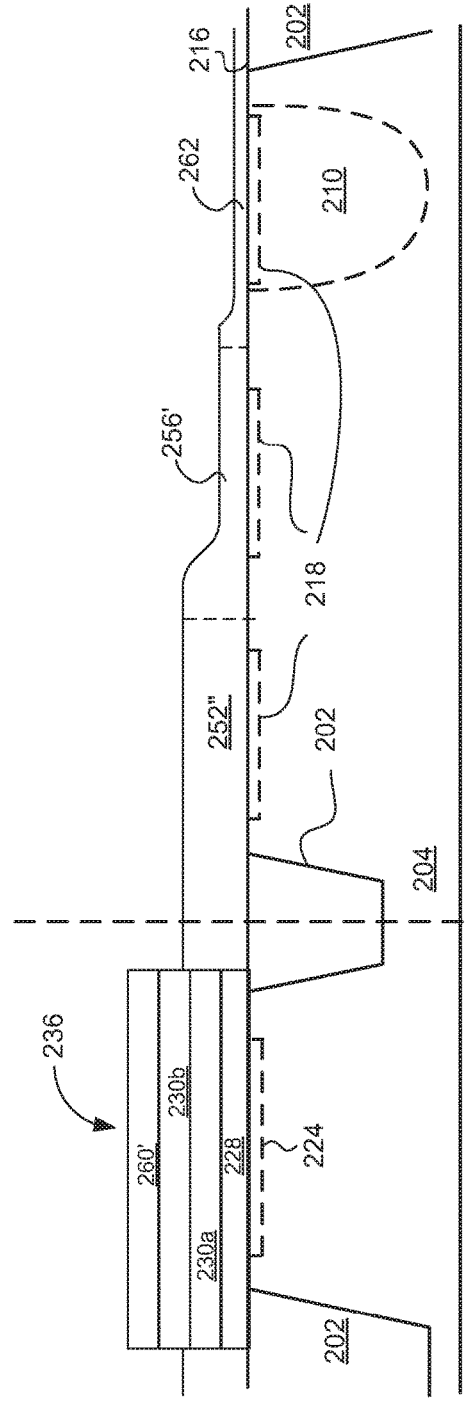

Next, referring to FIGS. 1 and 2L, an oxidation process is performed to form LV gate oxide 262 layer (step 122). In one embodiment, LV gate oxide 262 layer may be formed by radical oxidation processes, such as ISSG process, as described above. When LV gate oxide 262 layer is formed by ISSG, a thin LV gate oxide 262 layer, having a thickness from about 5 Å to about 10 Å, may be formed at or around the LV_MOS 212 area. The same radical oxidation process may also add thickness to I/O gate oxide 256' layer at or around I/O_MOS 215 area, HV gate oxide 252" layer at or around HV_MOS 214 area, and blocking oxide 260' layer of NV gate stack 236. In one embodiment, by controlling operation parameters in the LV gate oxide 262 layer formation, targeted thickness of LV gate oxide 262 layer may be achieved. The parameters may include time duration, temperature, pressure, reactants etc. of the ISSG or other radical oxidation processes. As will be explained in later sections, at least a portion of LV gate oxide 262 layer remains in the finished device as LV gate oxide 262 of LV_MOS transistor 212.

In one alternative embodiment, LV gate oxide 262 layer may be formed by RTO or conventional furnace oxidation. In such cases, thicknesses of blocking oxide 260 layer of NV gate stack 236 may not be affected. In some embodiments a thin high dielectric constant or high-k dielectric material can be used in place of the silicon dioxide. The high-k dielectric material may include, but is not limited to, hafnium oxide, zirconium oxide, hafnium silicate, hafnium oxy-nitride, hafnium zirconium oxide and lanthanum oxide deposited by, for example, atomic layer deposition (ALD), physical vapor deposition (PVD), a chemical vapor deposition (CVD), a low pressure CVD (LPCVD) or a plasma enhanced CVD (PECVD) process.

In some embodiment, forming LV gate oxide 262 layer may also encompass the formation of a nitrogen-rich silicon oxide film by providing a nitridizing atmosphere to substrate 204. The term "nitrogen-rich" may be understood to mean a peak nitrogen concentration of between approximately 0.5 to 3.5 atomic percent (at %) or higher. In addition, the term "nitridizing atmosphere" may be understood to mean an atmosphere that provides for the formation of nitrogen-rich silicon oxide films. In some embodiments providing the nitridizing atmosphere to the substrate 204 may encompass introducing nitrous oxide ($N_2O$) into the torch region at a first temperature. Advantageously, this first temperature may be selected to be sufficiently high to promote an exothermic reaction which forms the nitridizing atmosphere. Subsequently the atmosphere formed is directed to the silicon wafers in the process chamber through the fluidic coupling between the chambers. In one embodiment, nitrogen-rich oxide film may also be formed in I/O gate oxide 256' layer, HV gate oxide 252" layer, and/or blocking oxide 260' layer as they are also exposed to the "nitridizing atmosphere" during step 122. Nitrogen-rich or nitrided silicon oxide films may provide a barrier to diffusion of dopants such as boron, in subsequent fabrication processes. Hence threshold voltage degradation of transistors formed using nitrogen-rich silicon oxide gate dielectrics may be reduced. Additionally, such nitrided silicon oxide films may have improved hot carrier resistance and dielectric integrity.

At this stage of fabrication, a triple gate embodiment as best shown in FIG. 2L, in which blocking oxide 260 layer of NVM gate stack 236 as well as top dielectric layers (gate oxides 252",256', and 262) of HV_MOS 214, I/O_MOS 215, LV_MOS, each having a distinctively different thickness, are formed. In one embodiment, HV gate oxide 252" is thicker than I/O gate oxide 256', and I/O gate oxide 256' is thicker than LV gate oxide 262. The fabrication process may progress to high-K dielectric formation and metal gate formation (HKMG process flow) that are described in FIG. 7.

Figure 3:
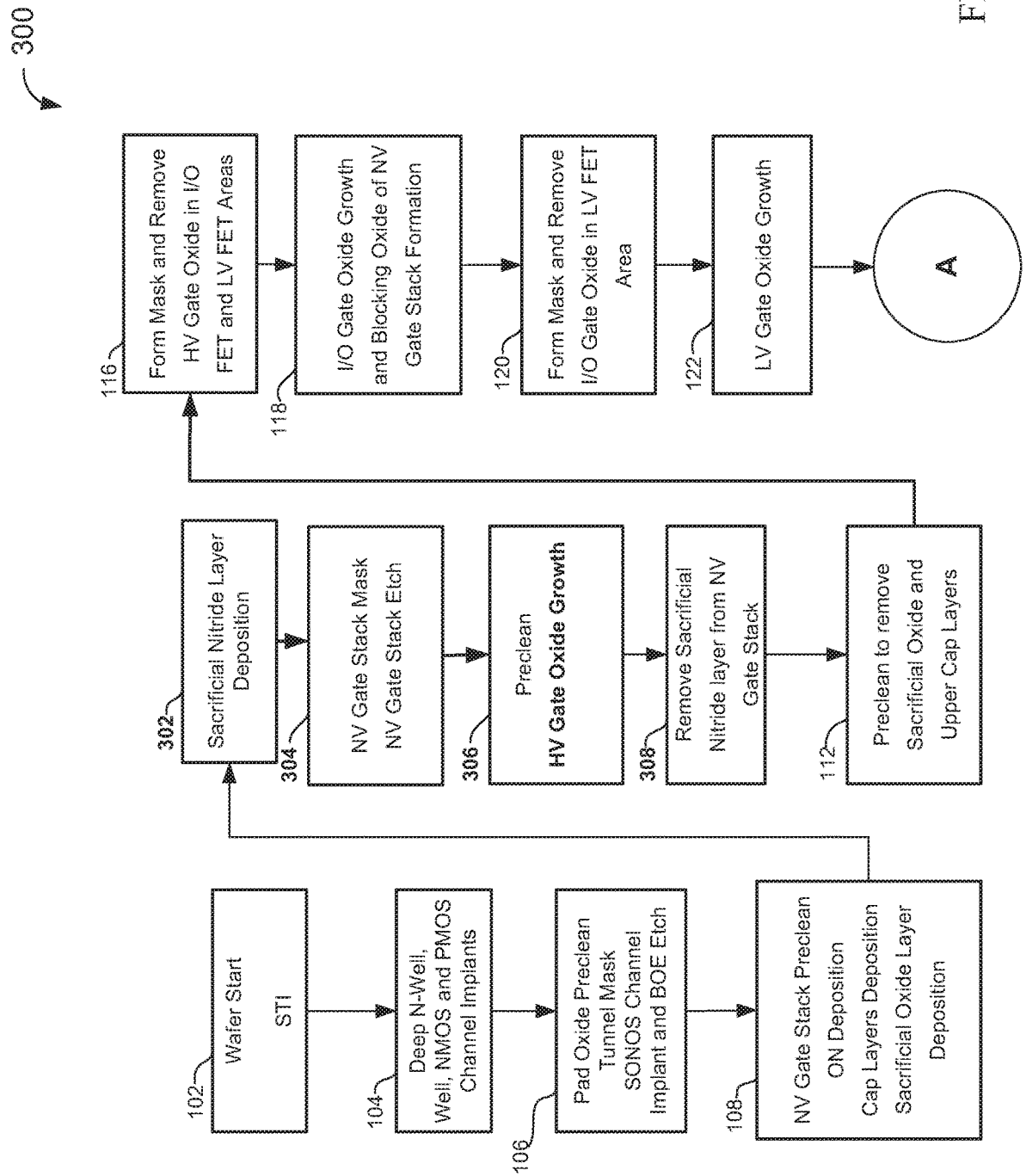
FIG. 3 is a flowchart illustrating another embodiment of a method for fabricating a memory cell including an embedded SONOS based NVM transistor and MOS transistors of an interim memory cell illustrated in FIG. 2L.
Figure 4A:
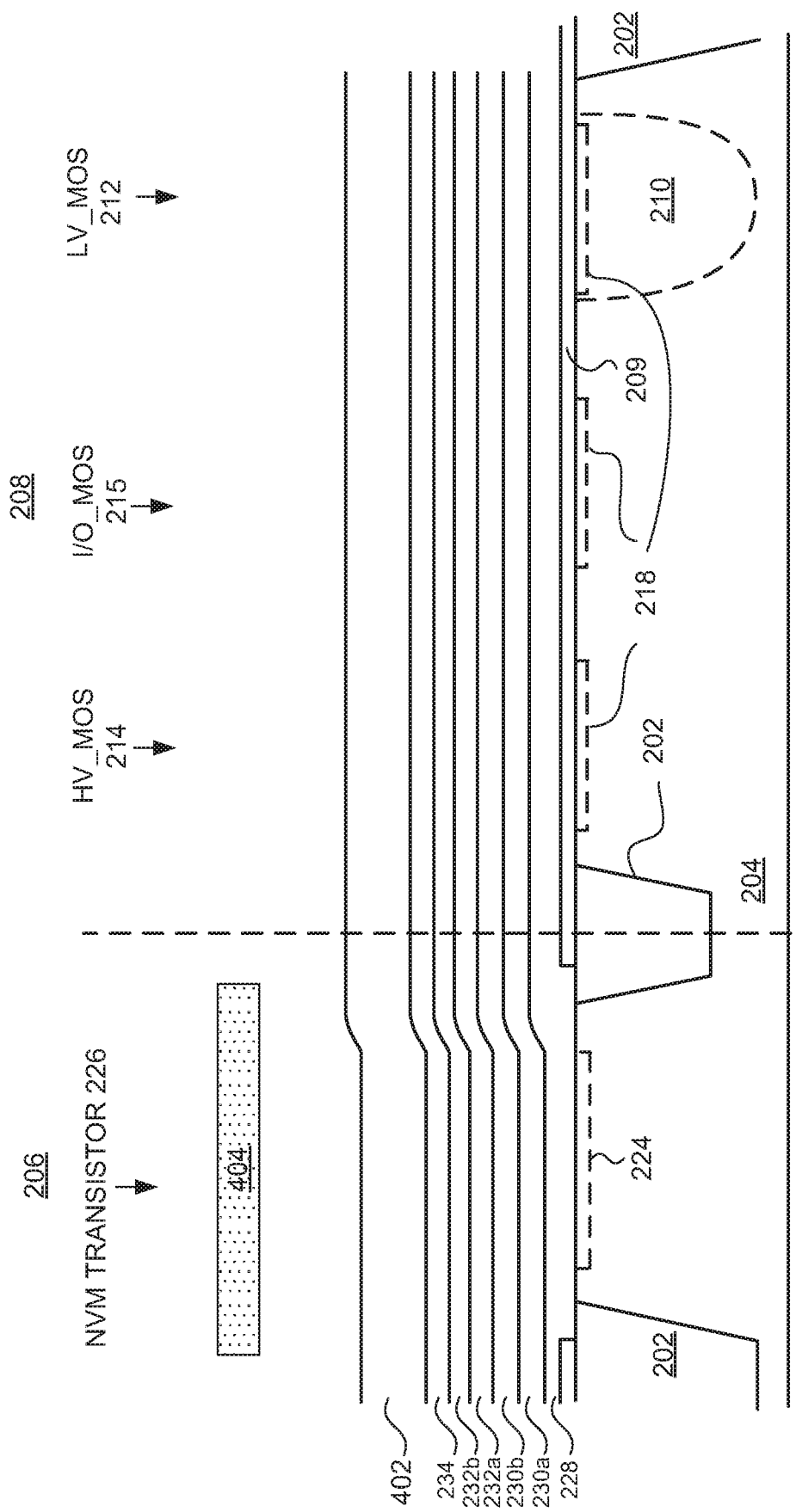
FIGS. 4A-4D are representative diagrams illustrating cross-sectional views of a portion of a memory cell during fabrication of the memory cell according to the method of FIG. 3.

FIG. 3 is a flow chart that describes a first alternative embodiment 300 to fabricate the embedded SONOS based NVM device, as best illustrated in FIG. 2L. Referring to FIG. 3, the fabrication process begins in a similar manner as the embodiment described in FIGS. 1 and 2A-2E (steps 102-108). As previously described, tunnel dielectric 228 layer, first and second charge-trapping layers 230a and 230b, first and second cap layers 232a and 232b, sacrificial oxide layer 234 are sequentially formed overlying substrate 204 in the first and second regions 206 and 208 of substrate 204. Referring to FIGS. 3 and 4A, sacrificial nitride layer 402 is formed overlying sacrificial oxide layer 234 (step 302). In one embodiment, sacrificial nitride layer 402 is formed by conventional process, such as CVD using $N_2O/NH_3$ and $DCS/NH_3$ gas mixtures or PVD, to achieve a thickness of from about 50 Å-200 Å.

Figure 4B:
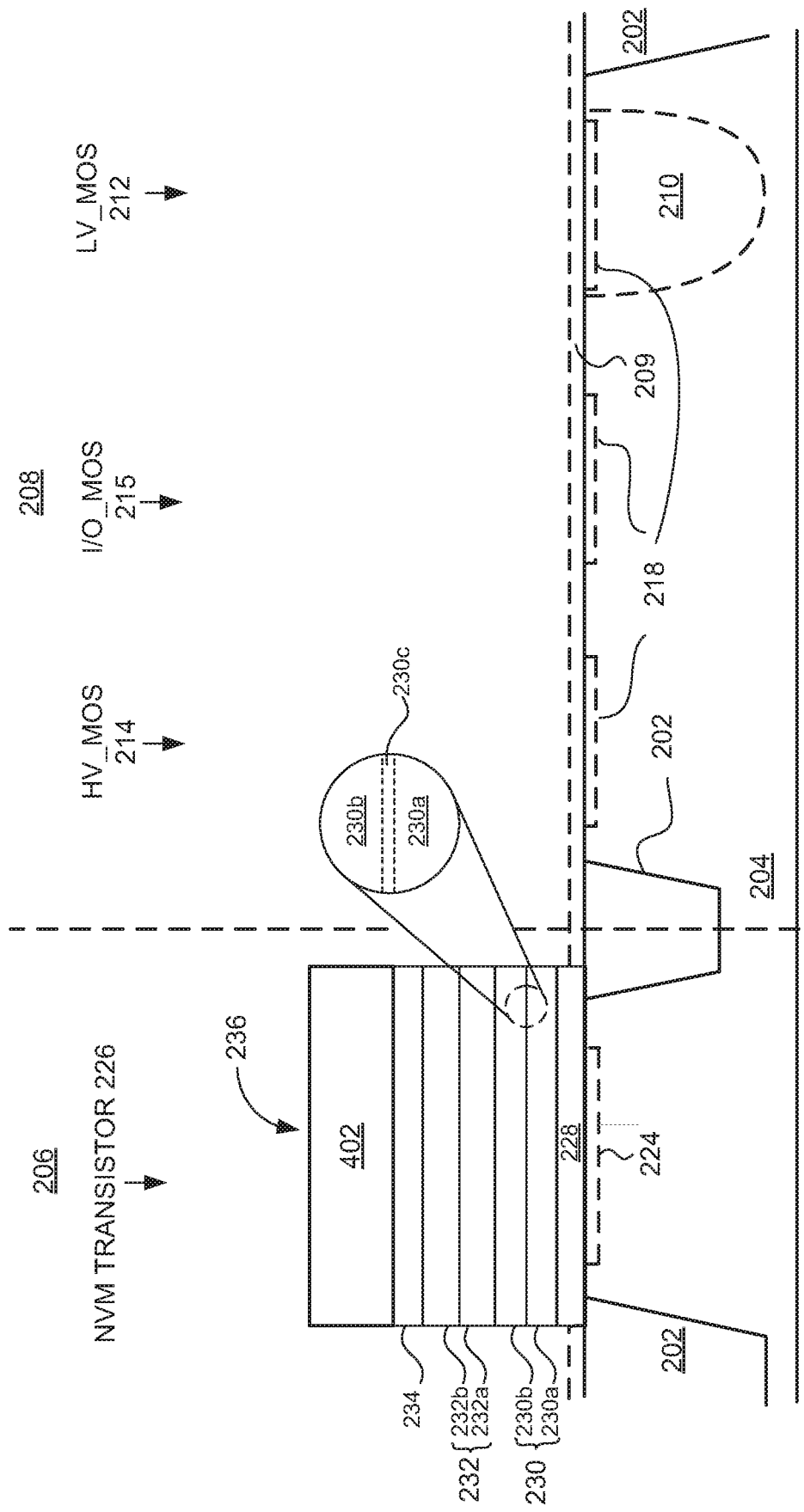

Referring to FIG. 4A still, a patterned mask layer 404 is formed on or overlying the sacrificial nitride layer 402, and referring to FIG. 4B, sacrificial nitride layer 402, sacrificial oxide layer 234, multi-layer cap layer 232 and multi-layer charge-trapping layer 230, and tunnel dielectric layer 228 are etched or patterned to form NV gate stack 236. In one embodiment, NV gate stack 236 is disposed at least overlying channel 224 of NVM transistor 226 in the first region 206. The etching or patterning process may further remove various dielectric layers of NV gate stack 236 from the second region 208 of substrate 204 (step 304). The patterned mask layer 404 may include a photoresist layer patterned using standard lithographic techniques, and the NV gate stack 236 layers in second region 208 may be etched or removed using a dry etch process including one or more separate steps to stop on a surface of the tunnel dielectric 228 or pad oxide 209.

Referring to FIGS. 3 and 4B, a cleaning process is performed to removes any oxide, such as oxide in tunnel dielectric 228 and/or pad oxide 209, remaining in the first region 206 beyond NV gate stack 236, and in second region 208 to prepare substrate 204 for HV gate oxide growth (step 306). In one alternative embodiment, pad oxide 109 is not remove entirely or at all (shown as dotted line in FIG. 4B). In one exemplary implementation, residual tunnel dielectric 228 and/or pad oxide 209 may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 4C:
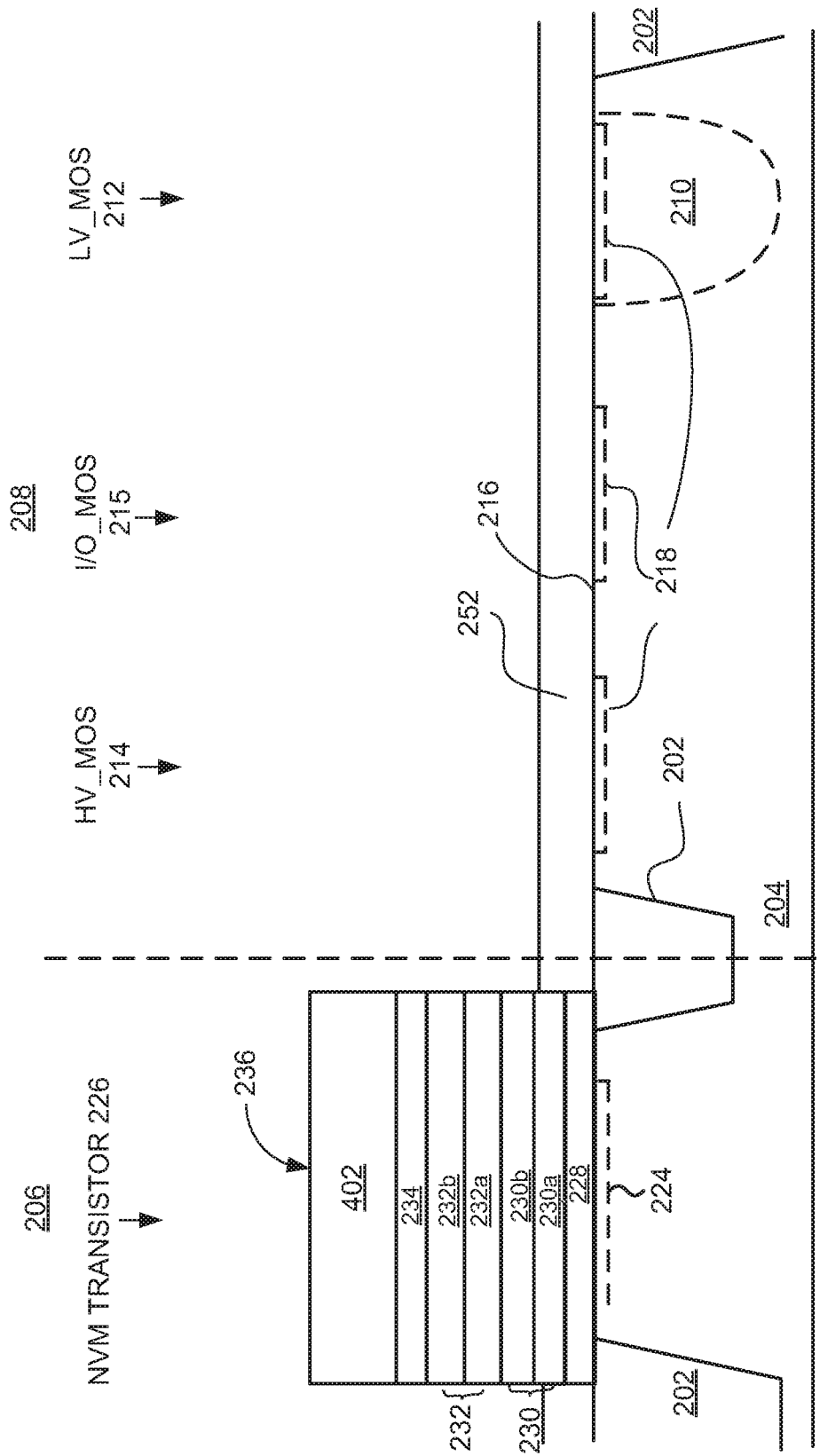

Next, referring to FIGS. 3 and 4C, HV gate oxide 252 layer is formed over substrate 204 (step 306), either directly or indirectly. In one embodiment, as best illustrated in FIG. 4C, the process starts when pad oxide 209 is completely or partially removed in a pad oxide preclean process. After pad oxide 209 is removed, either partially or completely, HV gate oxide 252 layer is formed by a rapid thermal dry oxidation (RTO) process, a conventional or furnace oxidation process, a chemical vapor deposition process (CVD), or other non-radical oxide forming processes known in the art, or a combination thereof. In one embodiment, HV gate oxide 252 layer may be grown to a thickness of from about 100 Å-200 Å. In one embodiment, remaining pad oxide 209 after the pre-clean process may become part of the later grown HV gate oxide 252 layer.

It is the understanding that it may take an extended period for the oxidation process (RTO or furnace oxidation) to grow a relatively thick HV gate oxide 252 layer. During the long oxidation process, it may effect oxide growth in tunnel dielectric 228 of NV gate stack 236. As a result, tunnel dielectric 228 may have an unexpectedly thick structure which may adversely affect the operations of the eventual NVM transistor 226. In one embodiment, the electrical performance of NVM transistor 226, such as programming/erasing by tunneling, may be degraded. Another potential issue with the relatively long HV gate oxide 252 layer growth is that moisture in STIs 202 oxide may also creep in under NV gate stack 236 and increase the tunnel dielectric 228 thickness. Both these mechanisms may lead to significant increase in tunnel dielectric 228 thickness, resulting in degradation of the tunneling of electrons/holes during programming/erasing, and the Program/Erase Vts and Vt window of the eventual NVM transistor 206. The relatively thick sacrificial nitride 402 (50 Å-200 Å) disposed at the top of NV gate stack 236 may help minimize or eliminate the encroachment of oxidizing species, such as $H_2O$, in or around tunnel dielectric 228, and therefore prevent any degradation of the electrical characteristics of the eventual NVM transistor 226.

Figure 4D:
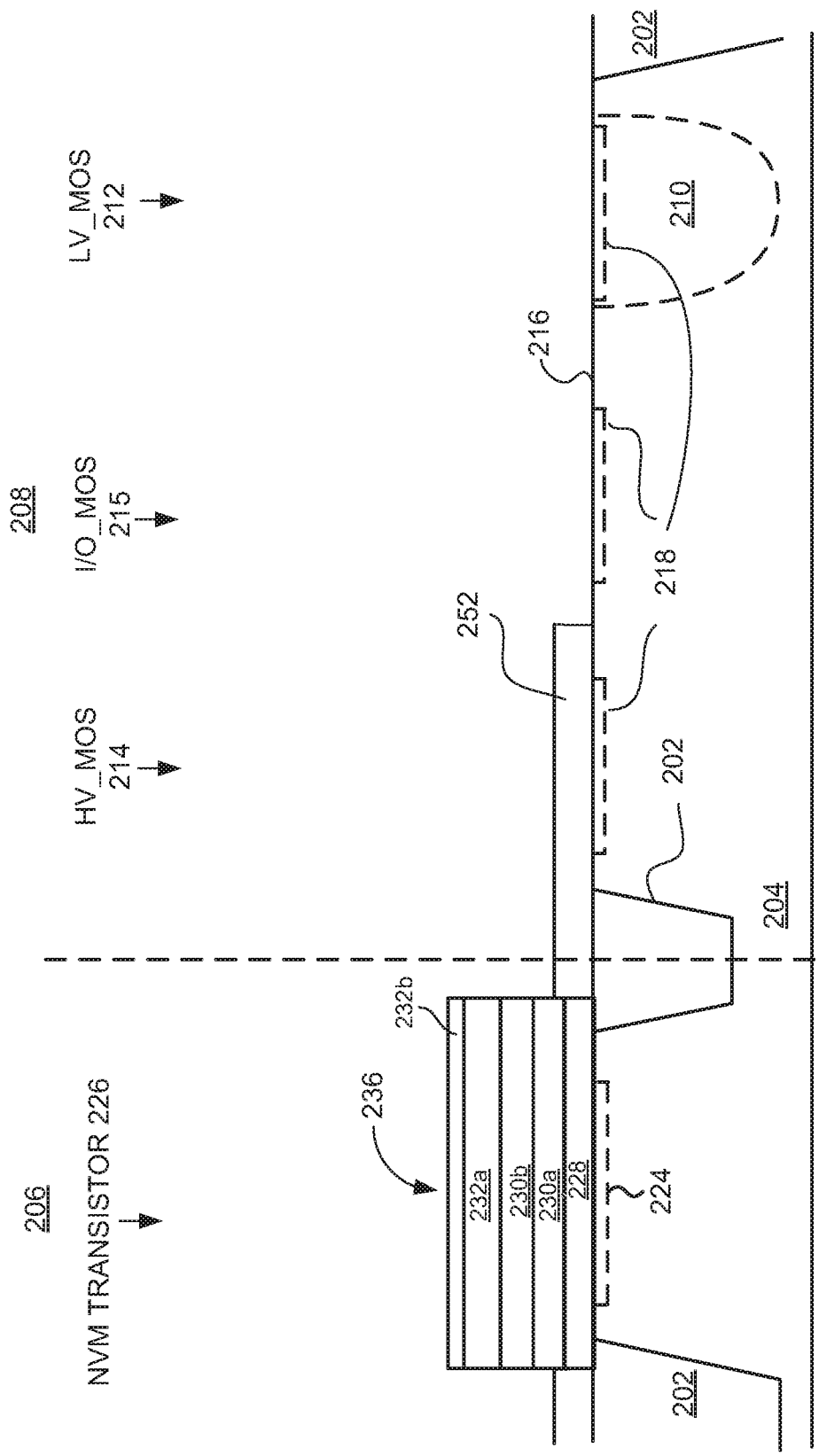

Next, referring to FIGS. 3 and 4D, after HV gate oxide 252 layer has been grown to a desired thickness, sacrificial nitride 402 is removed from NV gate stack 236 (step 308). In one embodiment, sacrificial nitride 402 may be removed by wet etch using hot phosphoric acid. The sacrificial nitride 402 etch is extremely selective to oxide, and may remove very small amount of oxide from NV gate stack 236 and HV gate oxide 252 layer.

Next, the fabrication process may continue on to remove the sacrificial oxide 234 and at least a top portion of second cap layer 232b, as best illustrated in FIG. 4D or FIG. 2G (step 112). Subsequently, the fabrication process may follow the sequence, steps 116-122, as shown in FIG. 1 to complete the triple gate embodiment of embedded SONOS based NVM device in FIG. 2L.

Figure 5:
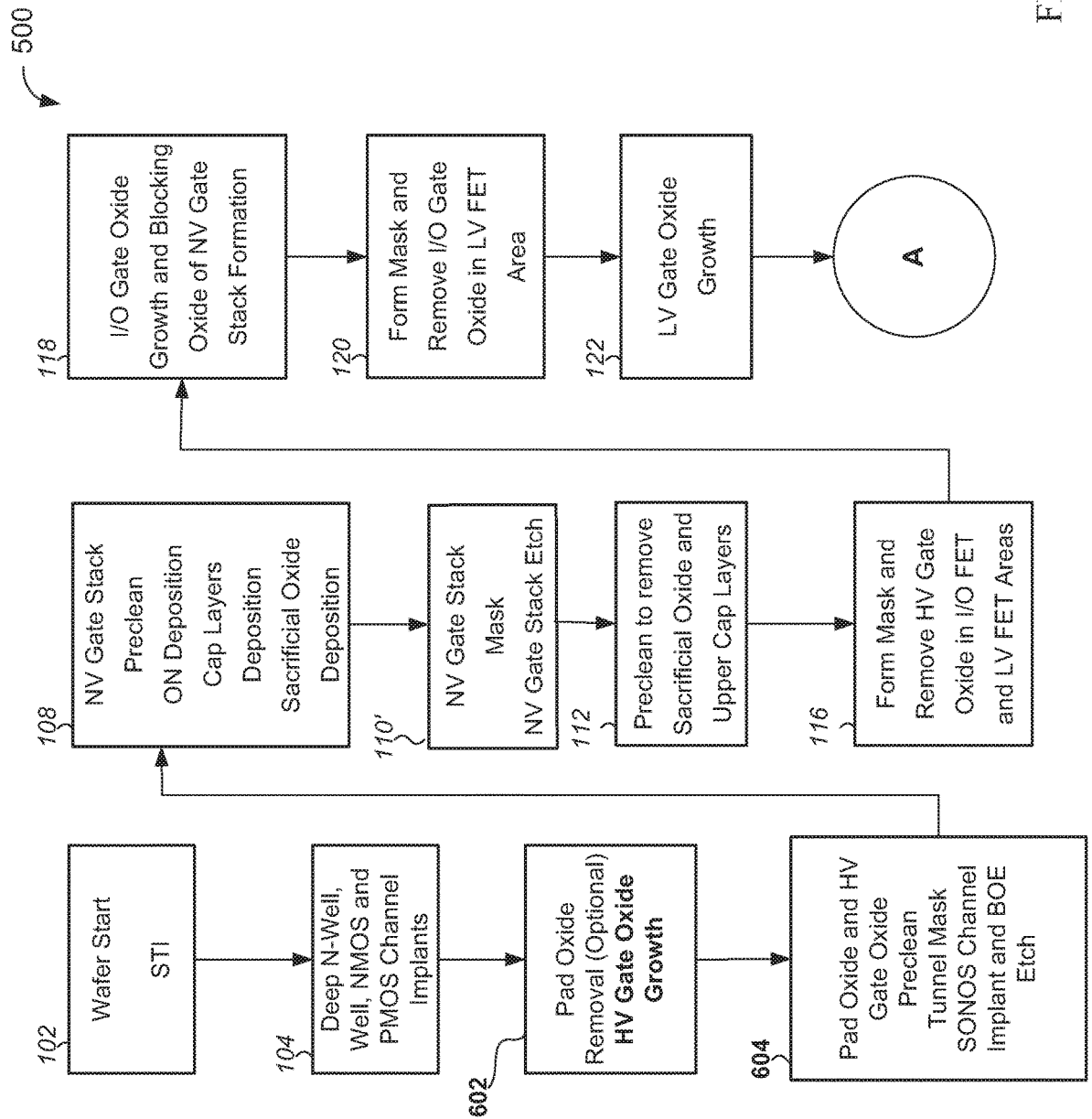
FIG. 5 is a flowchart illustrating another embodiment of a method for fabricating a memory cell including an embedded SONOS based NVM transistor and MOS transistors of an interim memory cell illustrated in FIG. 2L.

FIG. 5 is a flow chart that describes a second alternative embodiment 500 to fabricate the embedded SONOS based NVM device, as best illustrated in FIG. 2L. Referring to FIG. 5, the fabrication process begins in a similar manner as the embodiment described in FIGS. 1 and 2A-2B (steps 102-104). The main difference of this embodiment is that HV gate oxide 252 layer is formed prior to the formation of dielectric layers of NV gate stack 236.

Figure 6A:
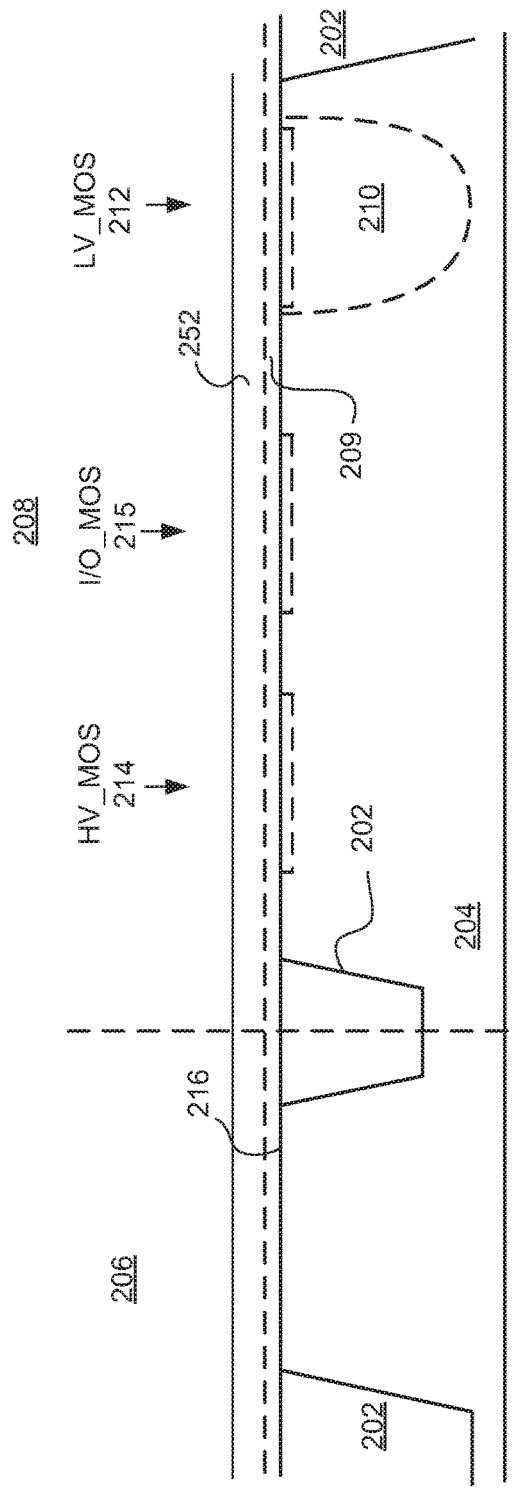
Figure 6B:
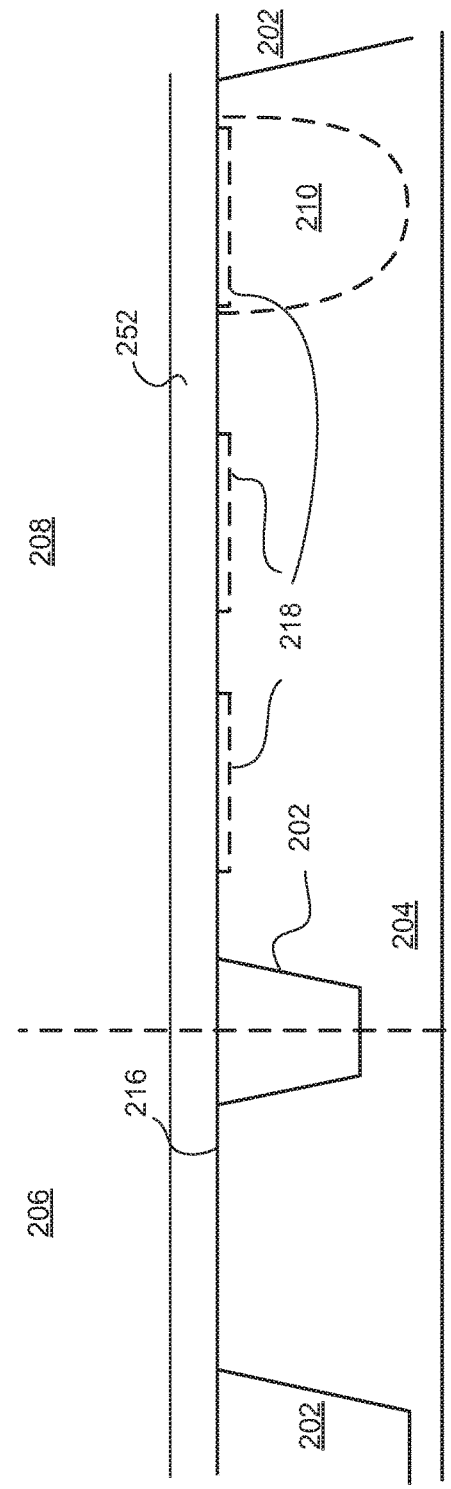

Next, referring to FIG. 5 and FIG. 6A, HV gate oxide 252 layer is formed on substrate 204 (step 602), either directly or indirectly. In one embodiment, as best illustrated in FIG. 6A, the process starts when pad oxide 209 is completely removed in a pad oxide preclean process. The pad oxide preclean may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After pad oxide 209 is removed, HV gate oxide 252 layer may be formed by a rapid thermal dry oxidation (RTO) process, a conventional or furnace oxidation process, a rapid and radical wet oxidation process such as in-situ steam generation (ISSG), a chemical vapor deposition process (CVD), or other oxide forming processes known in the art, or a combination thereof. In one embodiment, since NV gate stack 238 is yet to be formed, radical oxidation processes, such as ISSG, may be employed as it will not oxidize nitride in NV gate stack 236, as in step 114 of FIG. 1 or step 306 of FIG. 3.

In one embodiment, as an example, the oxidation process starts with dry RTO performed in a batch or single substrate processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form HV gate oxide 252 layer. In one embodiment, HV gate oxide 252 layer is grown, by oxidizing silicon substrate 204, on at least a portion of the surface 216 of substrate 204. In one alternative embodiment, RTO process may be substituted with a rapid molecular oxidation (dry or wet) which is a non-radical oxidation process. In another embodiment, HV gate oxide 252 layer is formed by a wet rapid and radical oxidation process, such as in-situ steam generation (ISSG). The wet rapid and radical oxidation may be performed in a batch or single substrate processing chamber with or without an ignition event such as plasma. For example, in one embodiment, HV gate oxide 252 layer may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr. to form radicals, such as, an OH radical, an $HO_2$ radical or an O diradical radicals. The oxidation process is carried out for a duration approximately in the range of 5-10 minutes for a single substrate using an ISSG process, or 30-120 minutes for a batch furnace process to effect growth of HV gate oxide 252 layer. During the period, HV gate oxide 252 layer is grown in both the first and second regions 206 and 208. In alternative embodiments, wet rapid and radical oxidation may be substituted by processes such as chemical vapor deposition (CVD), or other radical oxidation processes performed in a batch or single substrate processing chamber with or without an ignition event such as plasma as long as oxide will be grown or deposited to form HV gate oxide 252 layer. In one embodiment, by controlling operation parameters in the HV gate oxide 252 layer formation, targeted thickness of HV gate oxide 252 layer may be achieved. The parameters may include time duration, temperature, pressure, reactants etc. of the RTO, ISSG, furnace oxidation, and CVD processes. As will be explained in later sections, at least a portion of HV gate oxide 252 layer remains in the finished device as HV gate oxide 252 of HV_MOS transistor 214. In one embodiment, to withstand the relatively high operating voltage, desirable thickness of HV gate oxide 252 layer may be targeted to be approximately between 100 Å-200 Å, or other thicknesses. It will be understood that such a range is merely illustrative and is not meant to be limiting. In one embodiment, HV gate oxide 252 layer may be formed, in the processes described in FIG. 6A, to be thicker or thinner than the desirable thickness. Excessive or inadequate HV gate oxide 252 layer may be removed or added in later processes to achieve the desirable or final thickness of HV gate oxide 252 of HV_MOS transistor 214.

Alternatively, HV gate oxide 252 layer may be formed adjacent to at least a bottom portion of pad oxide 209 and substrate 204. As best illustrated in FIG. 2D, pad oxide 209 is not completely removed during the pad oxide preclean process, as previously described. In one embodiment, the pad oxide preclean process is omitted. In another embodiment, the pad oxide preclean process is carried out but does not remove the entirety of pad oxide 209. HV gate oxide 252 layer may then be formed in the aforementioned processes at least over the remaining or bottom layer of pad oxide 209. In both embodiments, remaining pad oxide 209 becomes a part of the finished HV gate oxide 252 layer. In one embodiment, operation parameters of the pad oxide preclean process and the gate oxide formation process may be configured to achieve the combined thickness of HV gate oxide 252 layer. As previously discussed, the combined thickness of HV gate oxide 252 layer may be greater or less than the desirable or final gate thickness, and excessive HV gate oxide 252 layer may be removed or added in later processes. In one embodiment, since pad oxide 209 and HV gate oxide 252 layer are formed separately and individually, they may be different chemically, in stoichiometric composition and ratio, and/or physically. Moreover, there may be an interface (not shown) between pad oxide 209 and the later grown/deposited HV gate oxide 252 layer in the combined structure.

Next, referring to FIGS. 5 and 6C, a patterned tunnel mask 220 is formed on or overlying HV gate oxide 252 layer, ions (represented by arrows 222) of an appropriate, energy and concentration are implanted through a window or opening in tunnel mask 220 to form a channel 224 for NVM transistor 226 in first region 206, and tunnel mask 220 and HV gate oxide 252 layer in at least the window removed (step 604). Tunnel mask 220 may include a photoresist layer, or a hard mask formed, from a patterned nitride or silicon-nitride layer. In the embodiment that multiple NVM transistors 226 are present in first region 206, multiple channels 224 may be formed simultaneously.

In one embodiment, channel 224 for NVM transistor 226 may be a deep indium doped channel implanted with indium (In) at an energy of from about 50 kilo-electron volts (keV) to about 500 keV, and a dose of from about 5e11 cm$^{-2}$ to about 1e13 cm$^{-2}$ to form an n-channel NVM transistor 226. In one embodiment, implanting indium to form channel 224 of NVM transistor 226 improves the threshold voltage ($V_T$) uniformity of the finished NVM transistor from a sigma of $V_T$ from about 150 millivolts (mV) to about 70-80 mV. Optionally or additionally, a shallow doped channel is implanted with arsenic at an energy about 20 keV and a dose of from about 5e11 cm$^{-2}$ to about 1e13 cm$^{-2}$ at channel 224. Alternatively, BF$_2$ may be implanted to form an N-channel NVM transistor, or arsenic or phosphorous implanted to form a P-channel NVM transistor. In one alternative embodiment, channel for NVM transistor 226 may also be formed concurrently with channels 218 of the MOS transistors 212, 214, 215. In some embodiments, channel(s) 224 of N-channel NVM transistor(s) and P-channel NVM transistor(s) may be formed simultaneously, or separately.

In one embodiment, as illustrated in FIG. 6D, HV gate oxide 252 layer in the window or opening in the tunnel mask 220 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 220 includes photoresist material may be ashed or stripped using oxygen plasma. Alternatively, hard tunnel mask 220 may be removed using a wet or dry etch process.

Next, referring to FIG. 1 and FIG. 6D, the surface 216 of wafer 204 is cleaned or precleaned, a number of dielectric layers formed or deposited, a mask formed on or overlying the dielectric layers, and the dielectric layers etched to form a NV gate stack 236 in first region 206 (step 108). The preclean may be a wet or dry process. In one embodiment, it may be a wet process using HF or standard cleans (SC1) and (SC2), and is highly selective to the material of wafer 204. In one embodiment, SC1 is typically performed using a 1:1:5 solution of ammonium hydroxide (NH$_4$OH), hydrogen peroxide (H$_2$O$_2$) and water (H$_2$O) at 30° C. to 80° C. for about 10 minutes. In another embodiment, SC2 is a short immersion in a 1:1:10 solution of HCl, H$_2$O$_2$ and H$_2$O at about 30° C. to 80° C.

Next, referring to FIG. 6D, a number dielectric layers including tunnel dielectric 228, multi-layer charge-trapping layer 230, multi-layer cap layer 232, sacrificial oxide 234, may be disposed in the first and second regions 206 and 208 (step 108). One of the differences between the embodiment in FIG. 6D and FIG. 2E is that tunnel dielectric 228 is formed over HV gate oxide 252 layer, instead of pad oxide 209 in the second region 208.

Figure 6E:
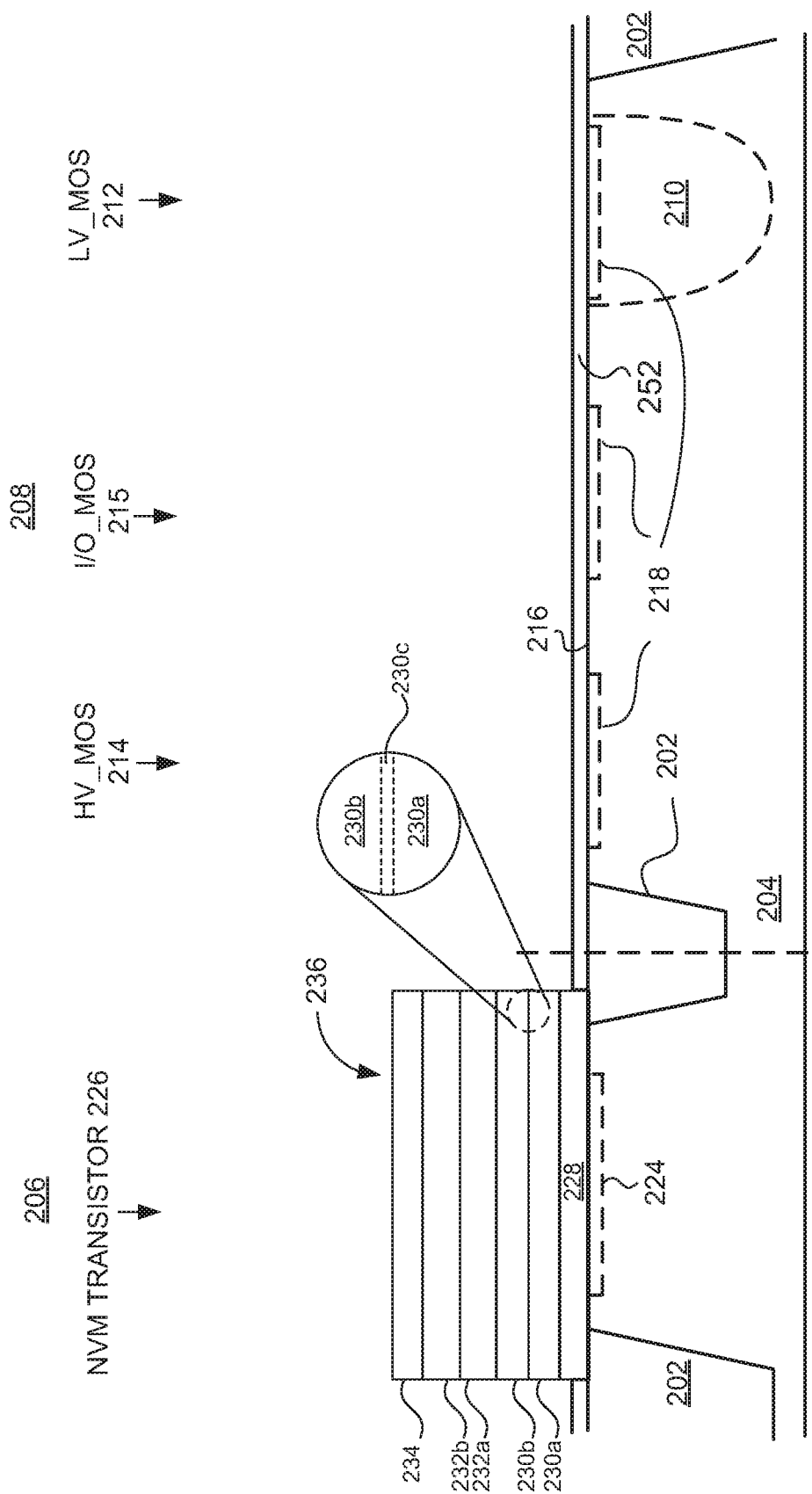

Next, referring to FIGS. 6D and 6E, a mask 280 may be formed on or overlying the dielectric layers, and the dielectric layers may then be etched to form NV gate stack 236 in the first region 206 (step 110'). The process step is very similar to step 110 in FIG. 1. One of the main differences are that the patterning step may stop at a top surface of HV gate oxide 252 layer, which was already formed at least in the second region 208, instead of pad oxide 209. In one embodiment, HV gate oxide 252 layer will become at least a portion of HV gate oxide 252 of the eventual HV_MOS transistor 214, as illustrated in FIG. 8J.

Next, the fabrication process may continue on to remove the sacrificial oxide 234 and at least a top portion of second cap layer 232b, as best illustrated in FIG. 2G (step 112). Subsequently, the fabrication process may follow the sequence, steps 116-122, as shown in FIG. 1 to complete the triple gate embodiment of embedded SONOS based NVM device in FIG. 2L.

Figure 7:
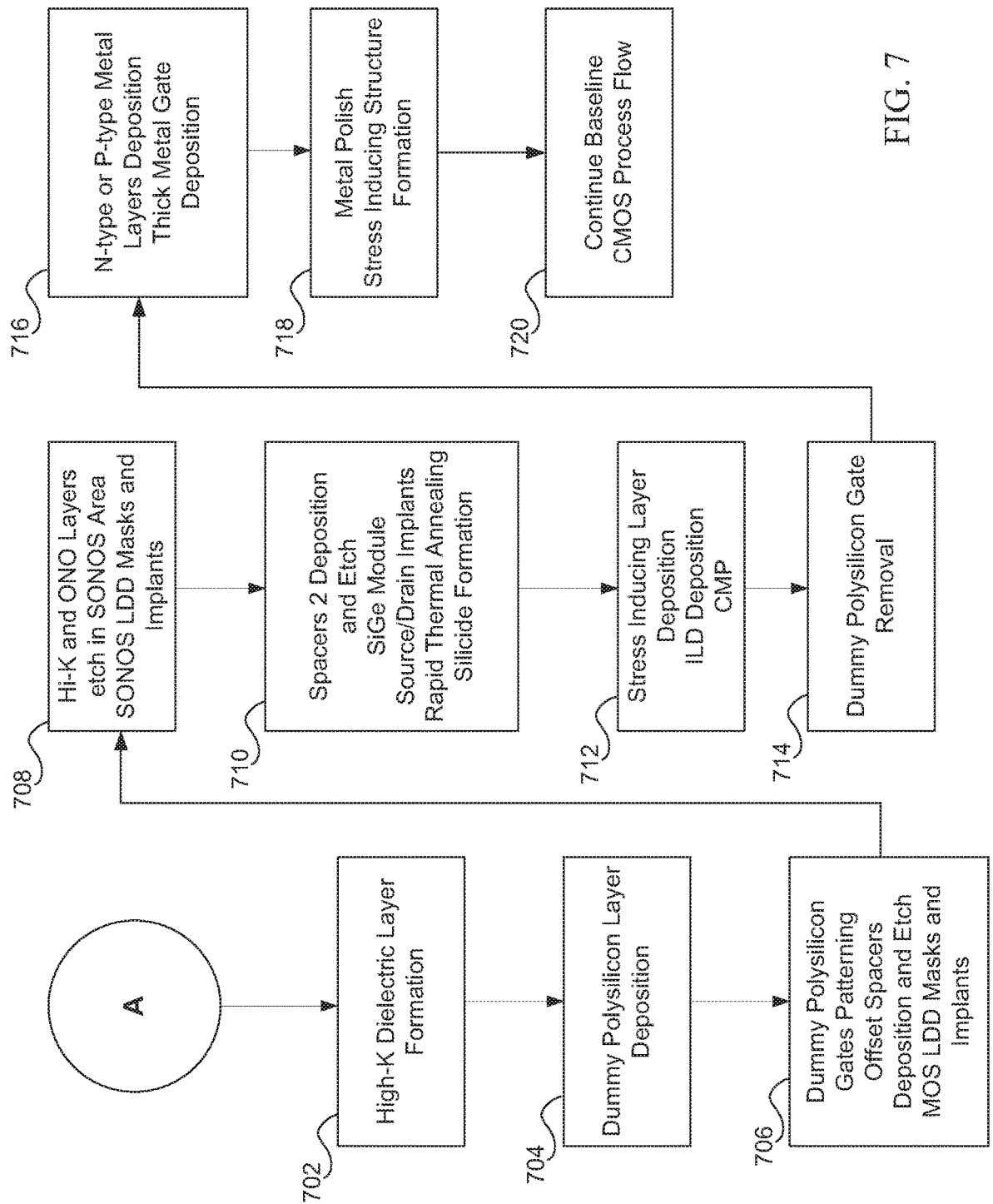
FIG. 7 is a flowchart illustrating an embodiment of subsequent steps to the embodiments in FIGS. 1, 3, and 5 for fabricating a memory cell or array including an embedded SONOS based NVM transistor and MOS transistors.

FIG. 7 is a flowchart illustrating an embodiment of subsequent steps to the embodiments in FIGS. 1, 3, and 5 for continuing fabrication of a memory cell or array including an embedded SONOS or MONOS based NVM transistor and MOS transistors. Among other elements, fabrication steps 702 to 720 describe the formation of high-K dielectric layer and metal gates for NVM transistor 226 and/or MOS transistors 214, 215, and 212 of NVM device 800. The embodiments disclosed in FIGS. 1, 3, and 5 are some of the fabrication methods to yield the embodiment of embedded NVM transistor with a triple gate structure (MOS transistors), as best illustrated in FIG. 2L. It will be the understanding that embodiments disclosed in FIGS. 7 and 8A-8J are applicable to same or similar structures as illustrated in FIG. 2L, and are not limited to the fabrication methods disclosed in FIGS. 1, 3, and 5.

Figure 8A:
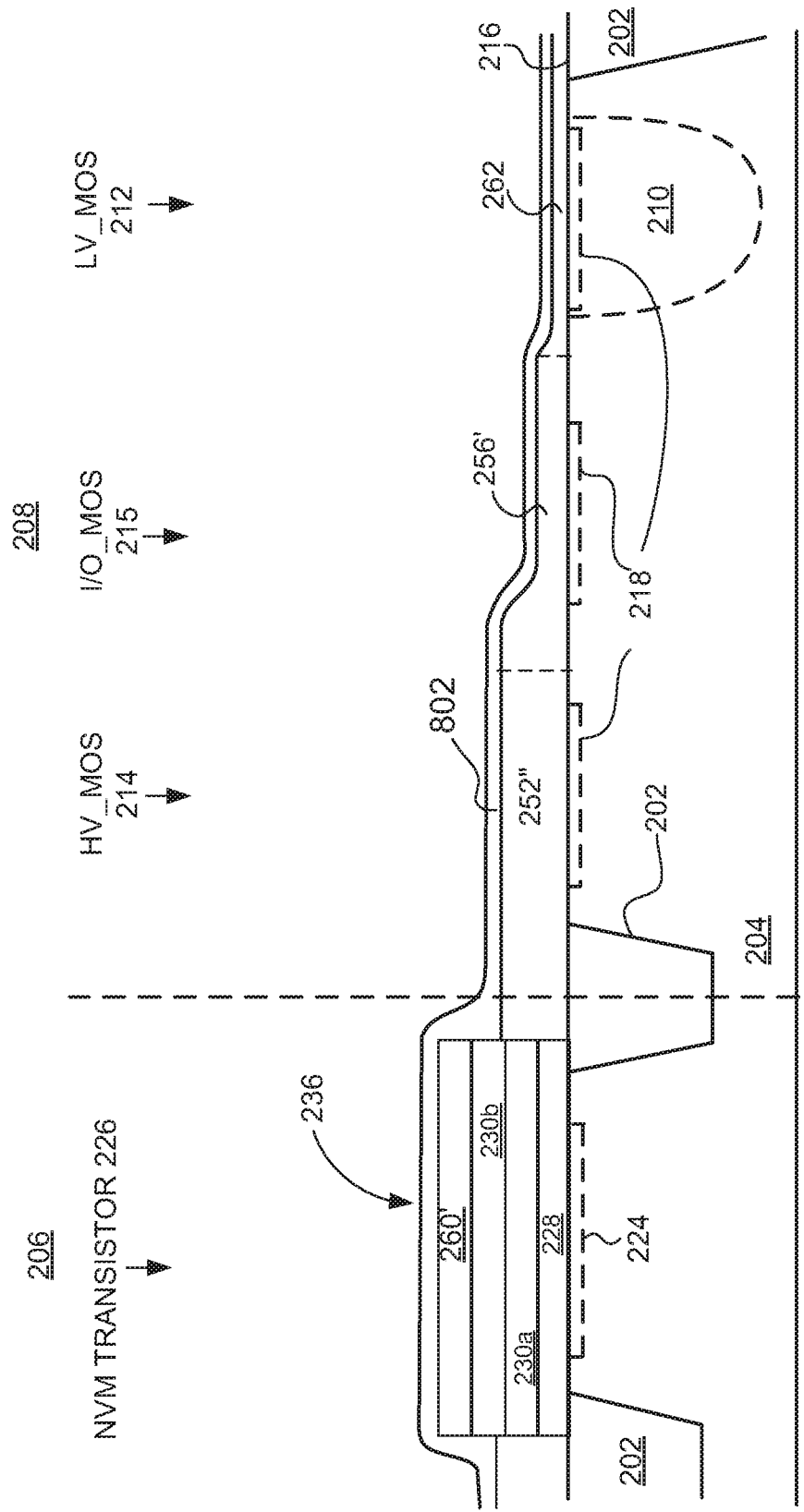
FIGS. 8A-8I are representative diagrams illustrating cross-sectional views of a portion of a memory cell during fabrication of the memory cell according to the method of FIG. 7.

Referring to FIGS. 7 and 8A, a high dielectric constant or high-K dielectric material or layer 802 is formed or deposited on or over NV gate stack 236 of NVM transistor 206, in first region 206 and in second region 208 (step 702). In one embodiment, the deposition step may concurrently form a multilayer blocking dielectric in NVM transistor 226, multilayer gate dielectric in MOS transistors 214, 215, and 212. In one embodiment, the multilayer blocking dielectric may include high-K dielectric layer 802 and blocking oxide layer 260' in NVM transistor 206. The multilayer gate dielectric may include high-k dielectric layer 802 and gate oxide 252",256' and 262 in HV_MOS transistor 214, I/O MOS transistor 215, and LV MOS transistor 212, respectively. The high-K dielectric layer 802 may include, but is not limited to, hafnium oxide, zirconium oxide, hafnium silicate, hafnium oxy-nitride, hafnium zirconium oxide and lanthanum oxide deposited to a physical thickness between about 3.0 nm and about 8.0 nm or other thicknesses by, for example, atomic layer deposition (ALD), physical vapor deposition (PVD), a chemical vapor deposition (CVD), a low pressure CVD (LPCVD) or a plasma enhanced CVD (PECVD) process.

It would be the understanding that high-K dielectric layer 802 may increase the overall thickness of multilayer blocking dielectric (blocking oxide 260' layer plus high-K dielectric layer 802) of NVM transistor 226. In some embodiments, the additional thickness, physical and/or electrical, may affect adversely or degrade the performance of NVM transistor 226. In one embodiment, it may be necessary to bring down the thickness of multilayer blocking dielectric to the operational range, for example approximately 3 nm to 4.5 nm. As best illustrated in FIG. 2I and its corresponding description, blocking oxide 260 layer may be primarily formed concurrently with I/O gate oxide 256 of I/O_MOS 215. The operation parameter details of the associated ISSG or radical oxidation process may be difficult to change since I/O gate oxide 256 may require to reach a target thickness of from about 5 nm to about 7 nm or other thicknesses, and it is part of the CMOS baseline process. Instead, in one embodiment, it may be more achievable to adjust the stoichiometry of cap layer 232, especially first cap layer 232*a*, to suppress or slow down the oxidation rate of cap layer 232 during the ISSG process. In one embodiment, oxygen concentration of first cap layer 232*a* and possibly second cap layer 232*b* may be reduced such that the thickness of blocking oxide 260 layer decreases, after the ISSG or radical oxidation process without altering the operation details as described in FIG. 2J. In one embodiment, cap layer 232 may be a pure nitride layer and may contain approximately 0% oxygen. In some optional embodiments, prior to step 702, one or more etching or wet clean processes may be performed on blocking oxide 260' layer, HV gate oxide 252" layer, I/O gate oxide 256' layer, or LV gate oxide 262 layer to achieve respective desired gate dielectric (gate oxide layer plus high-K dielectric layer 802) thickness(es).

In one alternative embodiment, when a polysilicon gate instead of a high-K metal gate is desired, high-K dielectric layer 802 is deposited overlying NV stack 236 of NVM transistor 226, and then removed. Transistors, in which high-K metal gate to be formed in first and second regions 206 and 208, may be protected by a mask (not shown in FIG. 8A) during the high-K dielectric layer 802 removal.

Figure 8B:
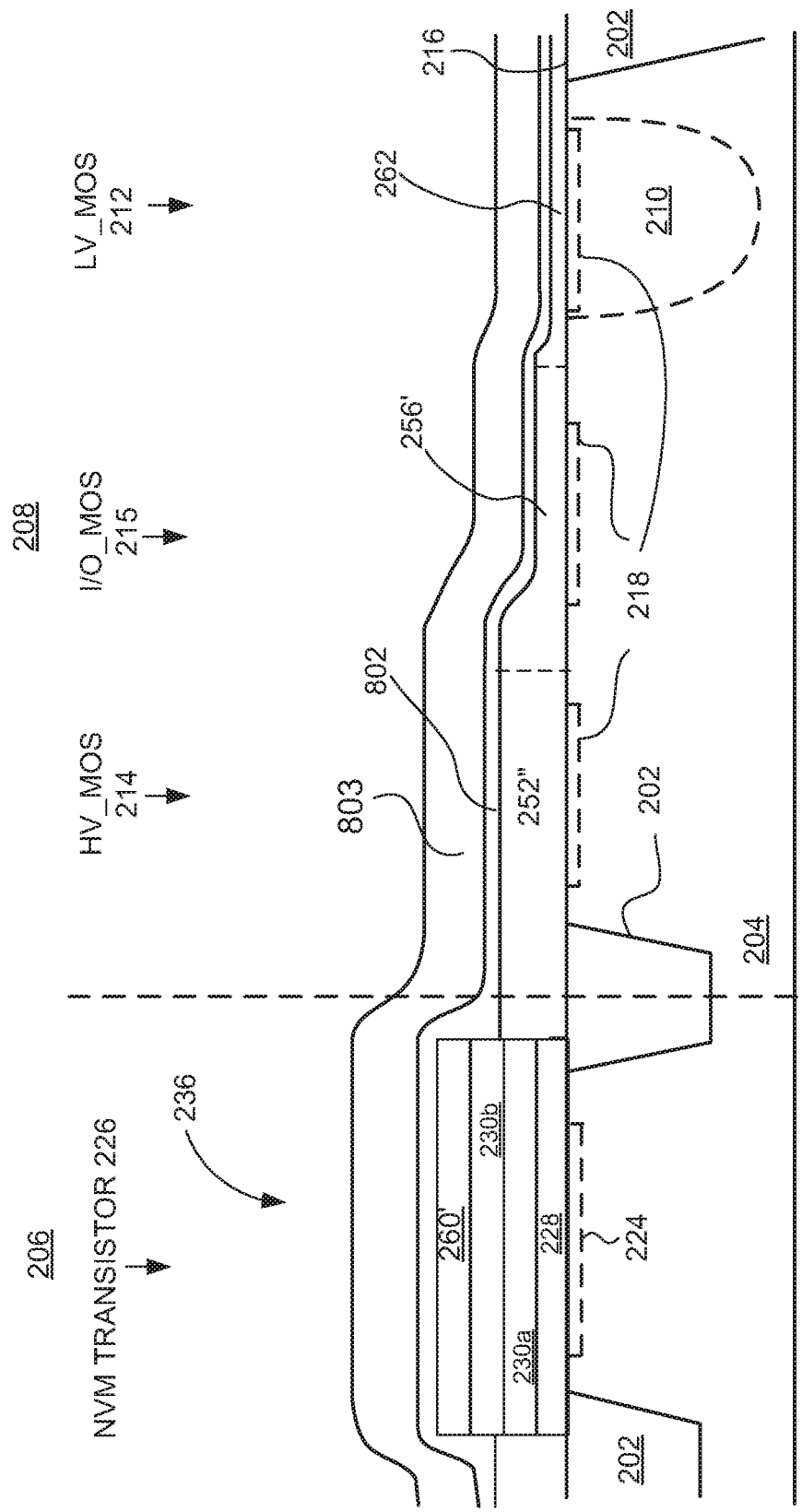

Referring to FIGS. 7 and 8B, a polysilicon or poly gate layer 803 is deposited or formed over substantially the entire surface of the substrate 204 in both the first and second regions 206 and 208, and all layers and structures formed thereon (step 704). In one embodiment, polysilicon gate layer 803 may be formed by chemical vapor deposition (CVD) to a thickness of from about 30 nm to about 100 nm, or other appropriate thicknesses. In other embodiments, polysilicon gate layer 803 may be formed by other deposition methods or fabrication methods known in the art. In one alternative embodiment, prior to poly gate layer 803 deposition, a thin layer of titanium nitride (not shown in this figure) is deposited over high-K dielectric layer 802, and poly gate layer 803 may be deposited overlying the thin titanium nitride layer. The titanium nitride deposition is optional, and may facilitate subsequent poly gate layer patterning or removal.

In the aforementioned alternative embodiment that high-K dielectric layer 802 is deposited overlying NV stack 236 of NVM transistor 226 but subsequently removed, polysilicon layer 803 may be deposited on blocking dielectric layer 206' of NVM transistor 226 instead.

Figure 8C:
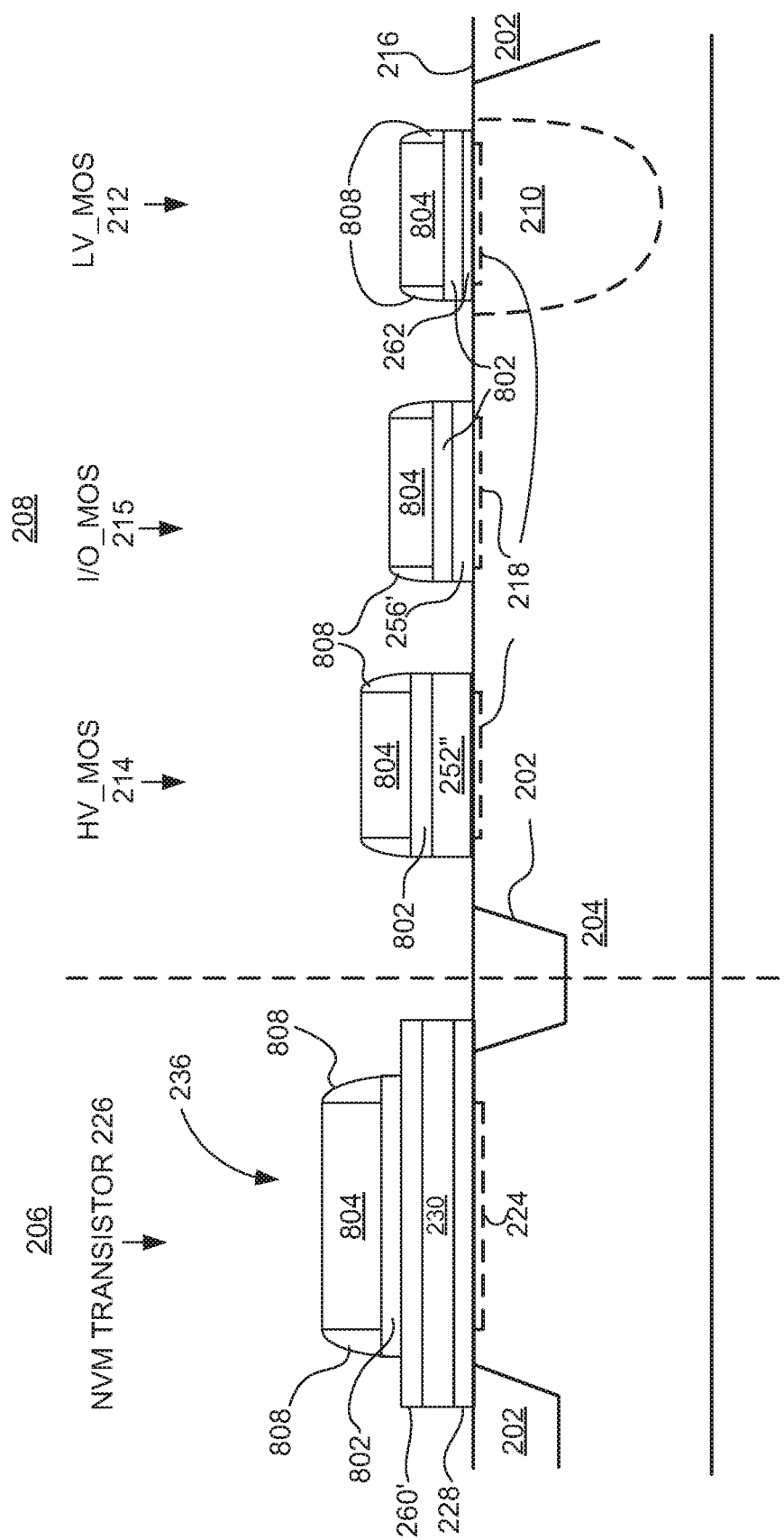

Referring to FIGS. 7 and 8C, a patterned photoresist mask (not shown) formed using standard lithographic techniques and polysilicon gate layer 803 is etched to stop on surfaces of the high-K dielectric layer 802, thereby forming dummy or sacrificial polysilicon gates 804 of NVM transistor 226 and MOS transistors 214, 215, and 212 (step 706). In one embodiment, polysilicon gate layer 803 may be etched using standard polysilicon etch chemistries, such as $CHF_3$ or $C_2H_2$ or $HBr/O_2$ which are highly selective to the underlying high-K dielectric layer 802. In one embodiment, multiple dummy polysilicon gates 804 may be formed simultaneously if there are more than one NVM transistors in the first region 206 and MOS transistors 212, 214, and 215 in the second region 208. In one alternative embodiment, polysilicon gate layer 803 may be etched to stop on surfaces of blocking oxide 260' layer when high-K dielectric layer 802 is not present. In another alternative embodiment, polysilicon gate layer 803 may be etched to stop on surfaces of the aforementioned thin layer of titanium nitride (if present).

Still referring to FIG. 8C, a first spacer layer is deposited and etched to form first sidewall spacers or offset spacers 808 adjacent to dummy or sacrificial polysilicon gates 804 of MOS transistors 212, 215, 214, and NVM transistor 226 (step 706). In one embodiment, the first spacer layer may include silicon oxide or silicon nitride, deposited to a thickness of from about 10 nm to about 30 nm, using any known CVD technique as described herein.

Subsequently, one or more lightly-doped drain (LDD) extensions may be implanted adjacent to and extend under first sidewall spacers 808 of one or more of MOS transistors 212, 214, 215 (step 706). In one embodiment, MOS LDDs are formed by implanting an appropriate ion species at an appropriate energy to an appropriate concentration. For example, drain extensions of P-type LV_MOS transistor 212, or any other P-type MOS transistors in the second region 208 may be formed by forming a photoresist mask through which selected transistors are exposed and implanting boron ions ($BF_2$) at an energy of from about 10 to about 100 kilo-electron volts (keV), and a dose of from about 1e12 $cm^{-2}$ to about 5e14 $cm^{-2}$ through the photoresist mask (not shown). Optionally, pocket or halo implants (not shown) for P-type LV_MOS transistor 212 or other P-type MOS transistors may be done through the same photoresist mask, by implanting Arsenic or Phosphorus at energy of 20 to 70 kilo-electron volts (KeV) and a dose of 2e12 cm$^{-2}$ to about 5e12 cm$^{-2}$. Similarly, MOS LDDs of N-type transistors, such as N-type I/O_MOS transistor 215 and HV_MOS transistor 214 may be formed by implanting arsenic or phosphorus at energy of from about 10 to about 100 kilo-electron volts (keV), and a dose of from about 1e12 m$^{-2}$ to about 5e14 cm$^{-2}$, also through an appropriately patterned photoresist mask. Halo or pocket implants for the N-type MOS transistors may also be done through this mask using Boron (BF$_2$) at energy of 5 to about 50 kilo-electron volts and a dose of 1e12 cm$^{-2}$ to 5e12 cm$^{-2}$.

Figure 8D:
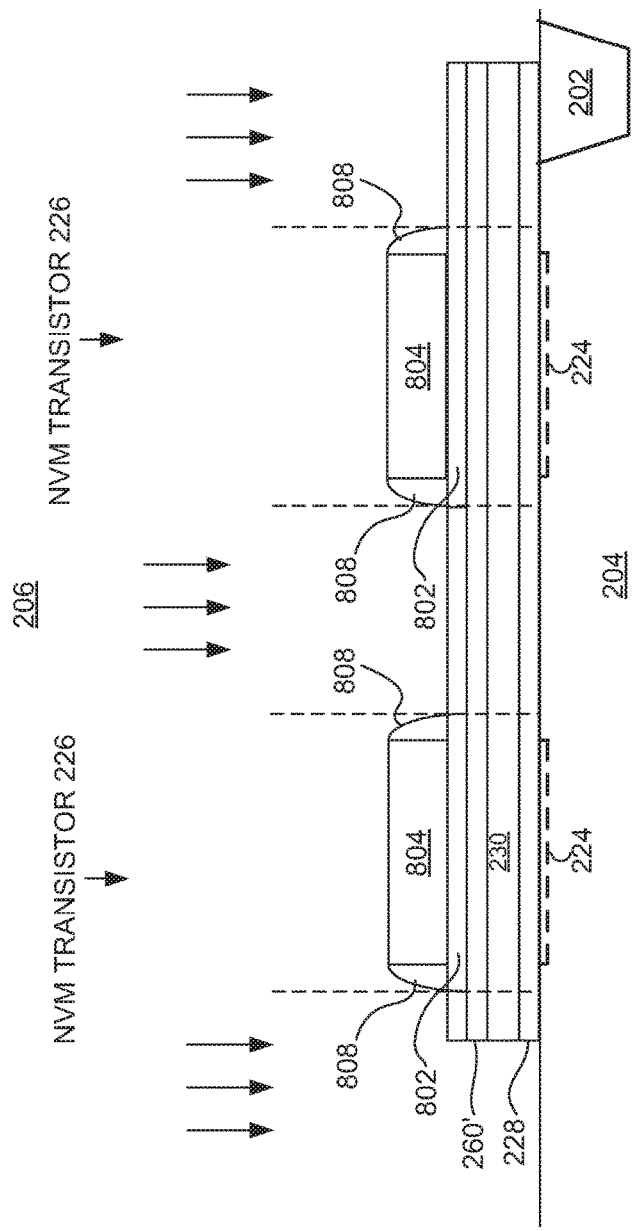

Referring to FIG. 8D, as previously described, polysilicon etch (step 706) may be stopped at high-K dielectric layer 802. As best illustrated in FIG. 8D, there may be residual high-K dielectric layer 802 overlying the substrate, and the removal of ONO and high-K dielectric layer 802 especially from source/drain regions of NVM transistor(s) is necessary. After ONO deposition and patterning (steps 108 and 110), ONO layers are removed from the second region 208. However, there may be ONO layers remaining in the first region 206, especially between NVM transistors 226. After high-K dielectric layer 802 deposition (step 702), polysilicon gate layer 803 deposition (step 704) and dummy polysilicon gate 804 patterning (step 706), there may still be high-K dielectric and ONO materials remaining at least in the source/drain areas of NVM transistors 226. In one embodiment, these remaining films in between NVM transistors 226 need to be removed so that the low energy NVM LDD implants (in subsequent step 706) may reach the required depths. Otherwise, in some embodiments, the junctions may be too shallow with insufficient doping which may degrade NVM transistor 226 performance.

Figure 8E:
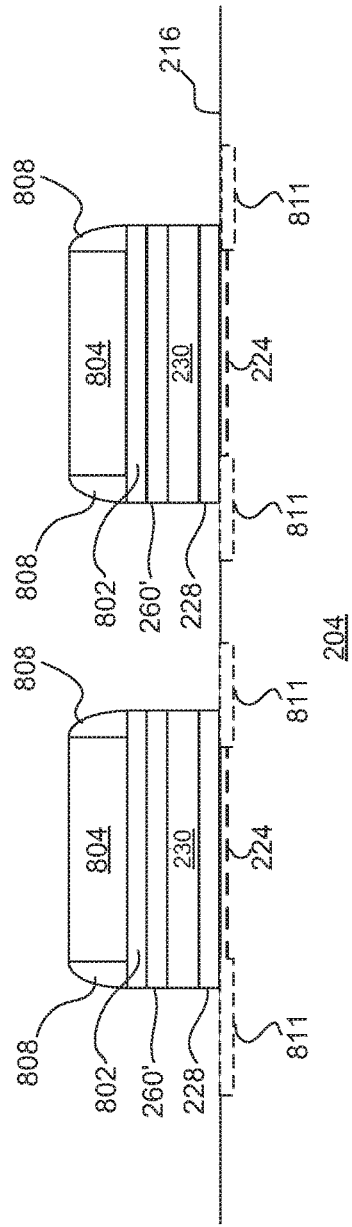

In one embodiment, remaining high-K dielectric layer 802 and ONO films in at least the first region 206 may be removed using the same photoresist mask (not shown) that is used for the NVM LDD implants 820 in subsequent step 708. As best shown in FIG. 8E, after first spacers 808 are formed by depositing and etching of spacer layer, the NVM LDD mask is set up and used to open NVM transistors 226 to implants. Before NVM LDD implants process, dry or wet etch may be done to remove remaining high-K dielectric layer 802 and remaining ONO film. The etch may stop at the tunnel oxide 228 of NVM transistors 226, or all the way to the substrate surface 216. In some embodiments, the dry or wet etch may also be used to remove any remaining high-K dielectric layer 802 or ONO film beyond NVM transistors 226 in the second region 208.

In one embodiment, NVM LDD mask (not shown) formed over the substrate 204, lightly-doped drain extensions 811 are implanted, adjacent to the NVM transistor 206, SONOS pocket or halo implants extending partially into the channel region 224 under the gate stack 236 of NVM transistor 226 implanted. The NVM LDD implants 811 and first sidewall spacers 808 for NVM transistor 226 may be formed using techniques substantially the same as those described above with respect to the MOS LDD implants and first sidewall spacers 808. For example, in one embodiment, NVM LDD implants 811 may be formed by an angled implant of, for example, arsenic or phosphorous at an energy of from about 5 to about 25 kilo-electron volts (keV), and a dose of from about 5e12 cm$^{-2}$ to about 2e14 cm$^{-2}$. Optionally, pocket or halo implants may be formed by implanting (BF$_2$) with energy of 10 to 30 kilo-electron volts and a dose of 1e12 cm$^{-2}$ to 3e12 cm$^{-2}$.

Figure 8F:
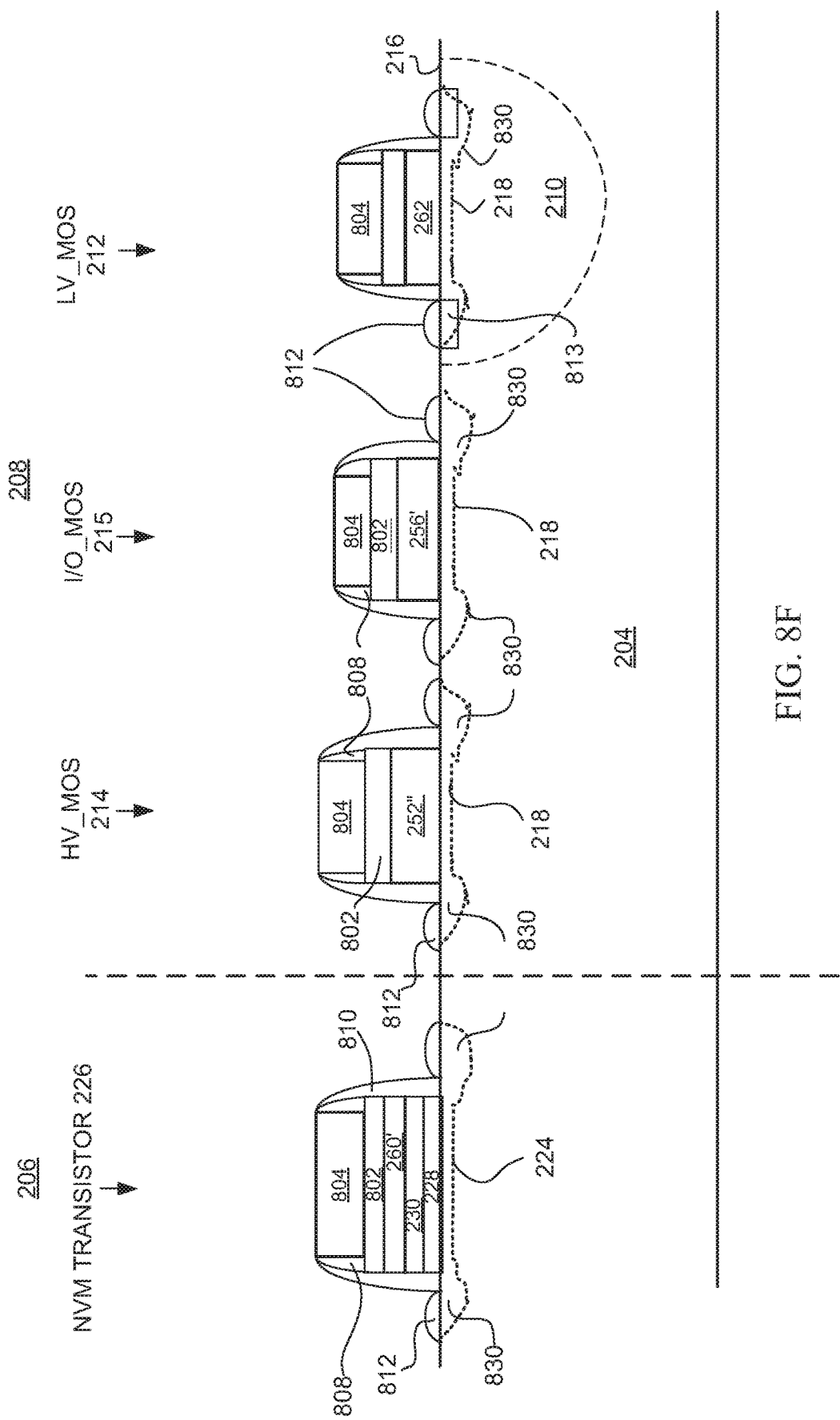

Referring to FIGS. 7 and 8F, second spacer layer is deposited and etched to form second sidewall spacers 810 adjacent to first sidewall spacers 808, of the NVM transistor 226 and MOS transistors 212, 214, and 215 (step 710).

Next, source and drain implants are performed to form source and drain regions 830 for all transistors and a silicide process performed (step 710). In one embodiment, a hard mask (HM) may be formed and patterned to expose only the S/D regions of P-type transistors, such as P-type LV_MOS 212, a silicon-germanium (SiGe) layer 813 may be deposited and etched, and the hard mask removed to form a strain inducing layer over the S/D regions of P-type LV_MOS 212, or other P-type transistors in first and second regions. As depicted, silicide regions 812 may be formed on exposed source and drain regions 830. Optionally, silicide regions 812 may also be formed over one or more dummy polysilicon gate 804 in the first and second regions 206 and 208. The silicide process may be any commonly employed in the art, typically including a pre-clean etch, cobalt or nickel metal deposition, anneal and wet strip. In one embodiment, rapid thermal annealing (RTA) may be performed on S/D regions before silicide formation process. In one embodiment, prior to the silicide process, a cleaning process may be performed to remove any remaining tunnel oxide layer 228 and/or pad oxide layer 209 on substrate surface 216 beyond the other transistors in the first and second regions 206 and 208.

Figure 8G:
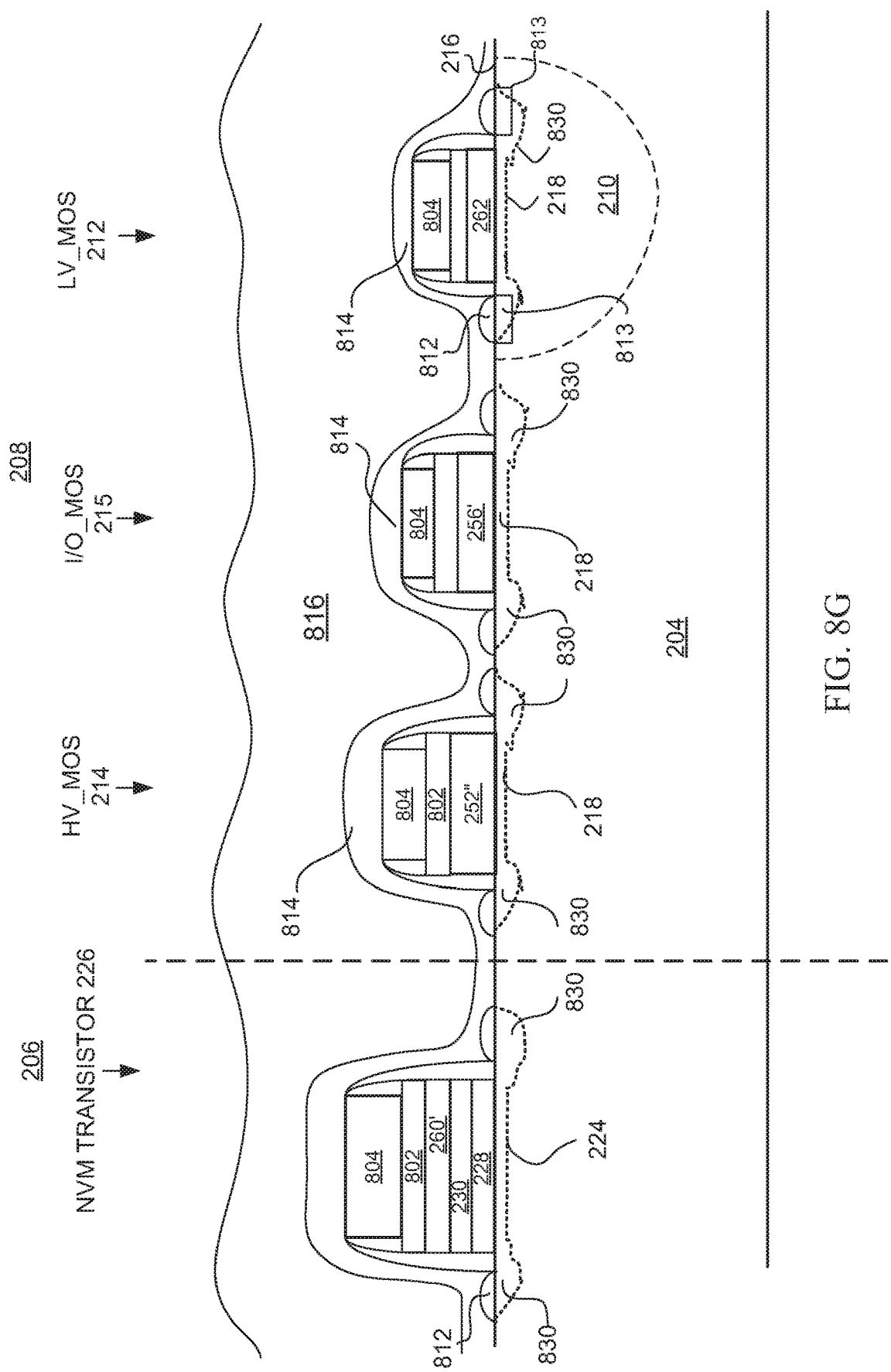

Referring to FIGS. 7 and 8G, the method further includes forming a stress inducing liner or layer 814, such as a stress inducing nitride layer, and depositing an interlevel dielectric (ILD) layer 816 over substantially the entire surface 216 of substrate 204 and all layers and structures formed thereon, and the ILD layer 816 planarized, for example, using a chemical mechanical polishing (CMP) process (step 712). The stress inducing layer 814 may include, a compressive or tensile nitride layer formed using a plasma enhanced chemical vapor deposition (PECVD) or a Bis-TertiaryButylAmino Silane (BTBAS) nitride layer, deposited or grown to a thickness of from about 30 nm to about 70 nm or other thicknesses, using any known technique including chemical vapor deposition. The ILD layer 816 may include, for example, silicon oxide, deposited or grown to a thickness of from about 0.5 μm to about 1.0 μm or other thicknesses, using any known CVD technique as described above.

Figure 8H:
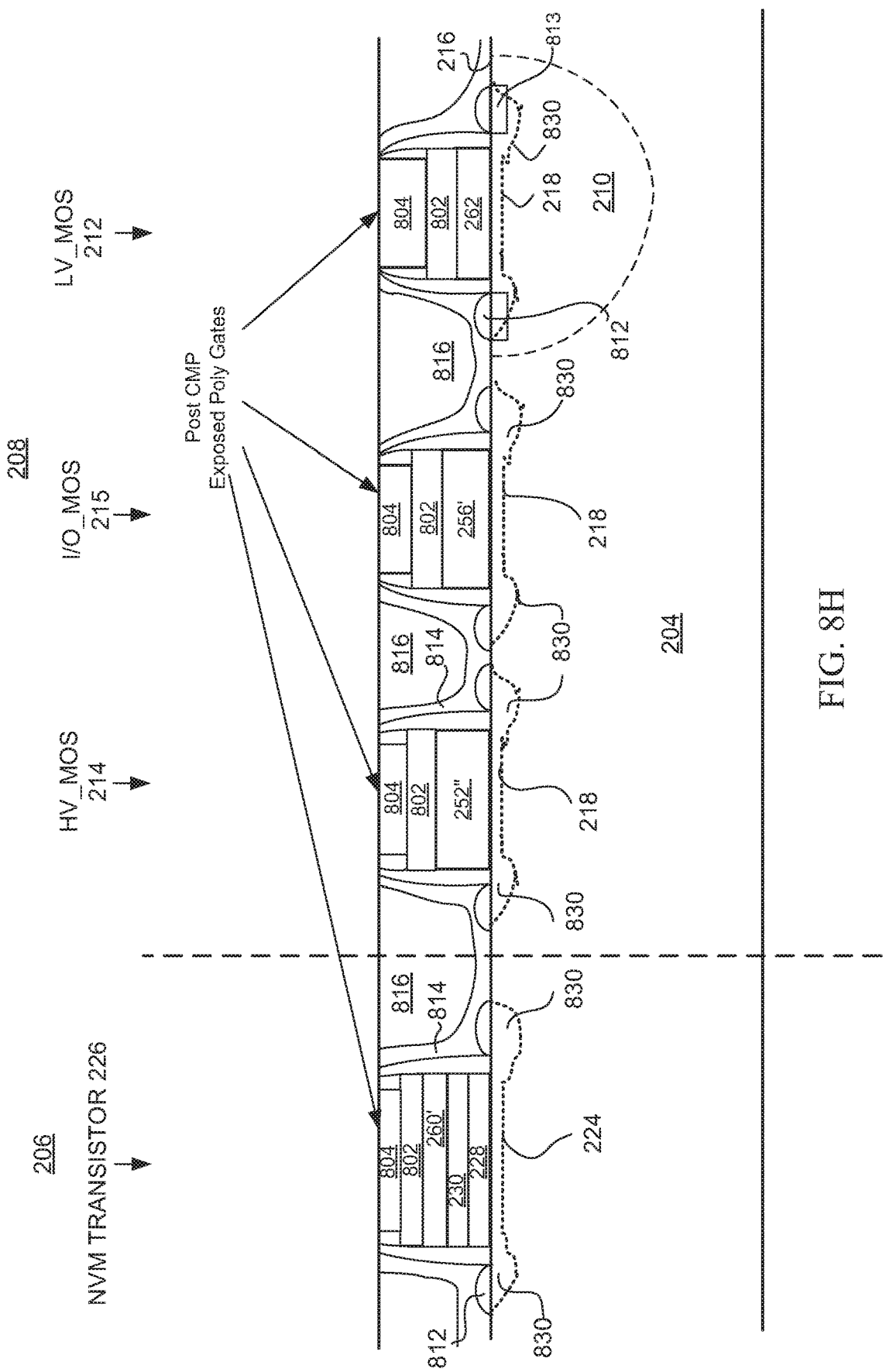

Next, referring to FIG. 8H, a chemical mechanical planarization (CMP) process may be performed to expose dummy polysilicon gates 804 in NVM transistor 226 in the first region 206, and MOS transistors 212, 214, and 215 in the second region 208. As best illustrated in FIG. 8H, a single CMP process is performed to exposed all targeted dummy polysilicon gates 804. Due to the possible difference in heights, different transistors may have different thicknesses of remaining dummy poly gates 804 after the CMP process step. In another embodiment, due to the potential difference in heights of various transistors, multiple CMP processes may be employed such that all targeted dummy polysilicon gates 804 are exposed.

Figure 8I:
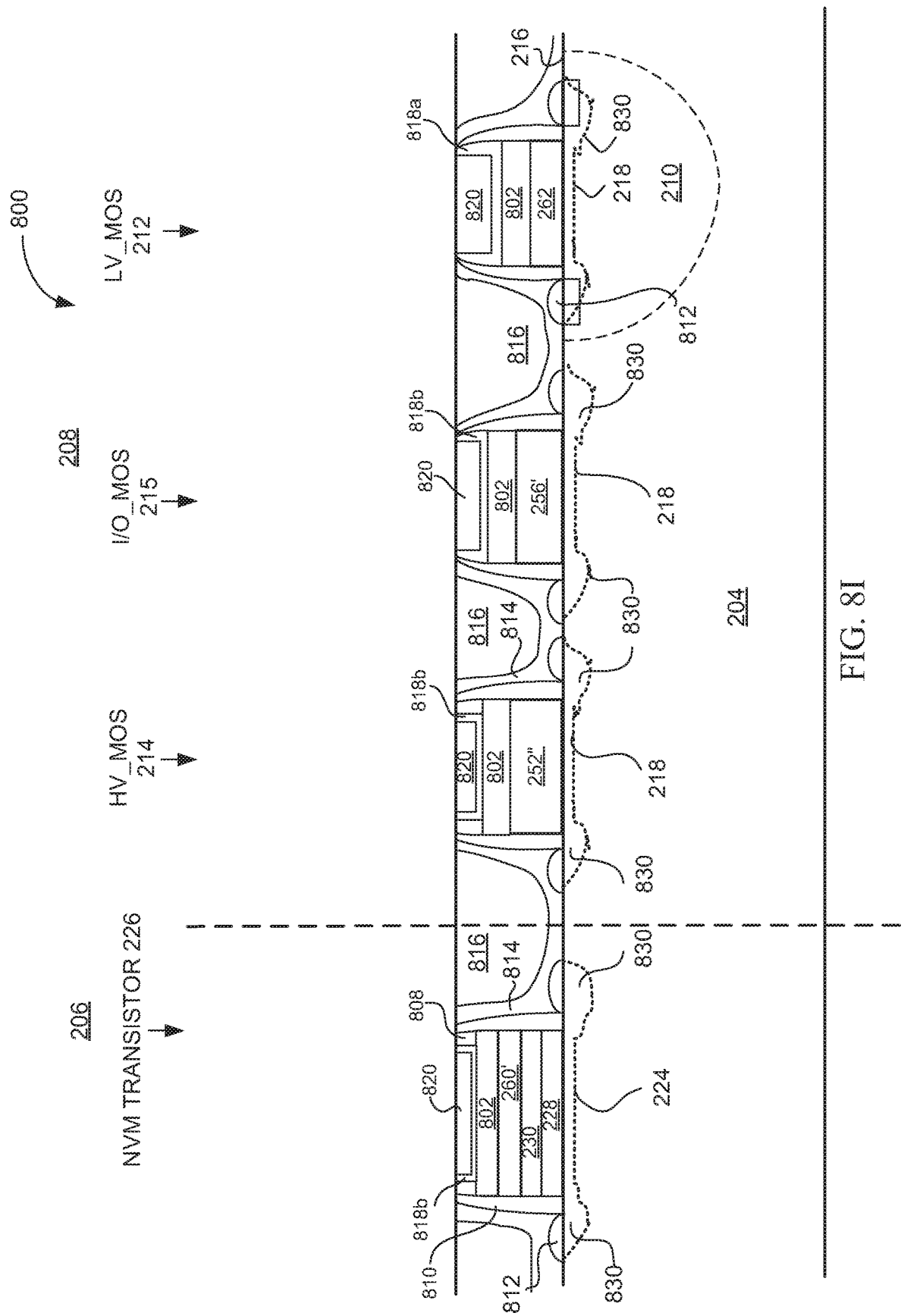
Figure 8J:
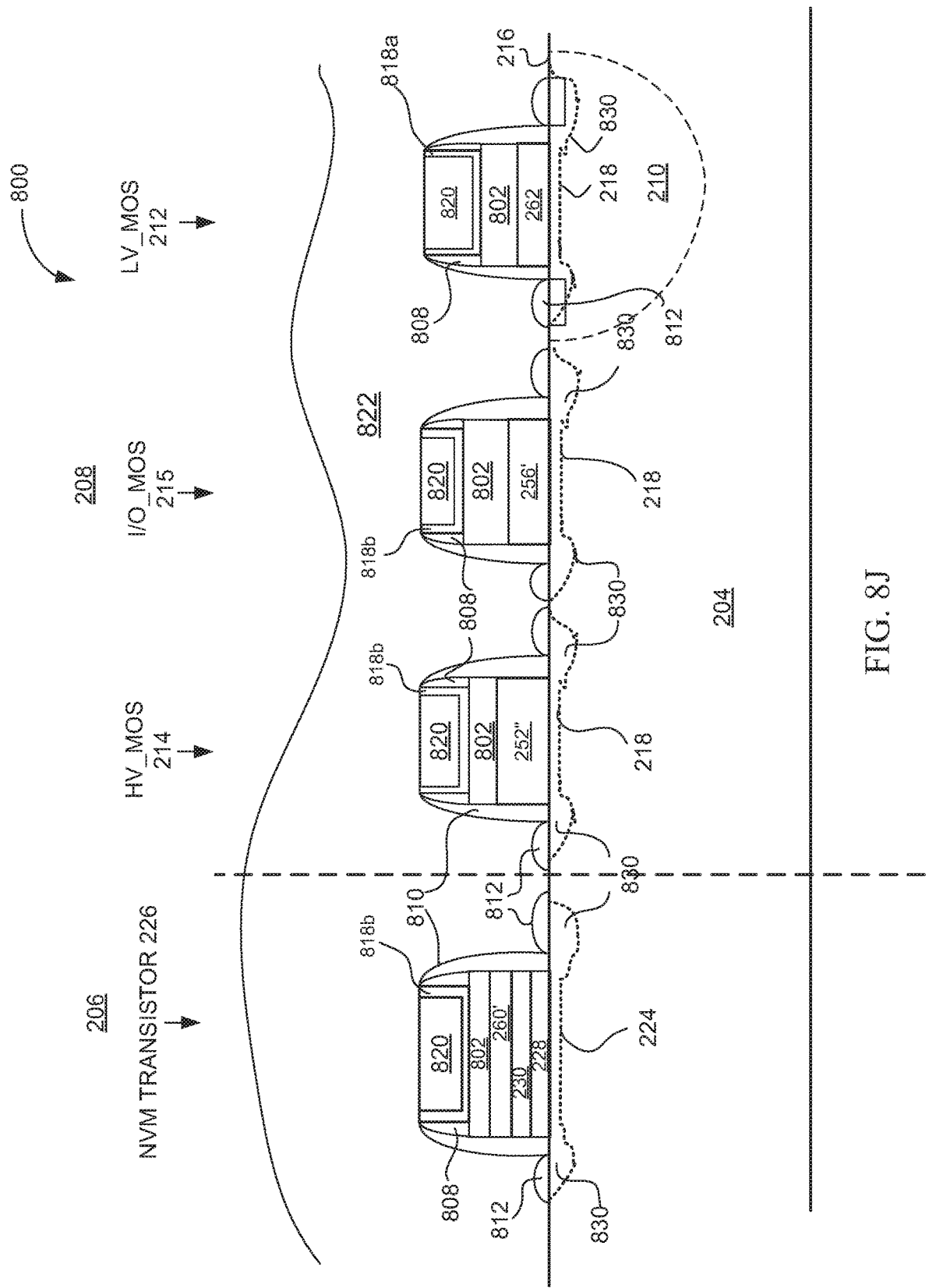
FIG. 8J is a representative diagram illustrating a cross-sectional view of a portion of a finished memory cell including an embedded SONOS based NVM transistor and MOS transistors fabricated according to the method of FIGS. 1, 3, 5, and 7.

Referring to FIGS. 1 and 8I, dummy polysilicon gates 804 are removed (step 714). In one embodiment, dummy polysilicon gates 804 may be removed using standard polysilicon etch methods that are known in the art, which are highly selective to the material of high-K dielectric layer 802, ILD layer 816, stress inducing liner 814, first and second sidewall spacers 808 and 810. In an alternative embodiment, one or more dummy polysilicon gate 804 in NVM transistor 226 and/or MOS transistors 212, 214, and 215 may not be removed, in cases wherein a polysilicon gate is preferred over a metal gate. In the embodiment wherein the thin titanium nitride is present, the polysilicon etch may stop at the thin titanium nitride layer (not shown) instead.

Still referring to FIG. 8I, metal layers 818 of multi-layer metal gates are formed, (step 716). In one embodiment, the multi-layer metal gates may replace the removed dummy polysilicon gates 804. In one embodiment, first or P+ metal layer 818a (high work function metal) is deposited over substantially the entire surface of the substrate 204 and all layers and structures formed thereon, a patterned photoresist mask (not shown) formed using standard lithographic techniques and the P+ metal layer etched to remove first or P+ metal layer from N-type NVM transistor(s) in the first region 206 and N-type MOS transistors 212, 214, and 215 in the second region 208, stop on surfaces of the high-K dielectric layer 802, thereby forming high work function gate 818a for any P-type NVM transistor(s) and P-type MOS transistor(s), such as P-type LV_MOS transistor 212 in FIG. 8I. The P+ metal layer 818a may include aluminum, titanium or compounds or alloys thereof, deposited to a thickness of from about 20 nm to about 100 nm or other thicknesses, using physical or chemical vapor deposition. In one embodiment, P+ metal layer 818a may be formed overlying high-K dielectric layers 802, and optionally on sidewalls, of the openings previously occupied by dummy polysilicon gates 804. P+ metal layer 818a formed over N-type MOS transistors may then be removed. Next, second or N+ metal layer 818b (low work function) is deposited over substantially the entire surface of the substrate 204, including the previously formed P+ metal layer 818a, such as around P-type LV_MOS 212. A patterned photoresist mask (not shown) is then formed and the N+ metal layer 818b etched to form a non-high or low work function metal gate 818b for any N-type transistors in the first and second regions 206 and 208, such as N-type NVM transistor 226, HV_MOS transistor 214, and I/O_MOS transistor 215 as best shown in FIG. 8I. In one embodiment, N+ metal layer 818b may be formed overlying high-K dielectric layers 802, and optionally on sidewalls, of the openings previously occupied by dummy polysilicon gates 804. The N+ metal layer 818b may include titanium, lanthanum, aluminum, or compounds or alloys thereof, deposited to a thickness of from about 20 nm to about 100 nm or other thicknesses, using physical or chemical vapor deposition. In general, any N-type transistor may include a low work function metal layer, such as N+ metal layer 818b, and any P-type transistor may include a high work function metal layer, such as P+ metal layer 818a, overlying their respective high-K dielectric layers 802. In one alternative embodiment, N-type NVM transistor 226 may include high work function metal layer, such as P+ metal layer 818a instead. The incorporation of the high work function metal layer in N-type NVM transistor 226 may provide improved erase performance to the device as it may avoid erase saturation. In the embodiment wherein the thin titanium nitride layer is present, P+ or N+ metal layer 818a or 818b may be deposited overlying the thin titanium nitride layer. Since the titanium nitride layer is very thin, it may not affect the property of the finished metal gates significantly. In other embodiments, the sequence of forming and patterning of P+ metal layer 818a and N+ metal layer 818b may be reversed. In one alternative embodiment, prior to forming of P+ or N+ metal layer 818a or 818b, a layer of tantalum nitride is deposited overlying the thin layer of titanium nitride (if present). The thin layer of titanium nitride and tantalum nitride will form a bottom barrier metal layer. As discussed, the bottom barrier metal layer disposed between P+ or N+ metal layer 818a or 818b and high-K dielectric layer 802 is optional.

Still referring to FIG. 8I, thick gate metal layer is deposited, etched and may be followed by planarization using a CMP process or multiple CMP processes to form thick metal gates 820, completing the formation of multilayer metal gates for the NVM transistor 226 and all of the MOS transistors 212, 214, and 215 (step 718). In one embodiment, thick gate metal layer may include a conformal layer of aluminum, titanium, titanium-nitride, tungsten or compounds or alloys thereof, overlying its respective P+ metal layer 818a or N+ metal layer 818b. Thick gate metal layer 820 may be deposited to a thickness of from about 0.1 μm to about 0.5 μm or other thicknesses, using physical or chemical vapor deposition, or other deposition methods known in the art. Due to the potential difference in heights of various transistors and the CMP process steps, there may be difference in finished thick metal gate 820. In one embodiment, NVM transistor 226, may also be referred to as Metal-Oxide-Nitride-Oxide-Semiconductor (MONOS) transistor because of the presence of multilayer metal gate (first or second metal layer 818a or 818b and thick gate metal layer 820). It will be the understanding that SONOS and MONOS are used interchangeably throughout the entire patent document. Optionally, a metal polish process may be applied to level out or planarize the top surfaces of thick gate metal layer 820 of NVM transistor 226, and MOS transistors 212, 214, and 216. In one alternative embodiment, prior to forming of thick gate metal layer 820, a top barrier metal layer (not shown in this figure) including titanium nitride and titanium, may be formed overlying P+ or N+ metal layer 818a or 818b. In one embodiment, the top barrier metal layer is optional.

Next, the standard or baseline CMOS process flow is continued to substantially complete the front end device fabrication (step 720), yielding the structure shown in FIG. 8J. In one embodiment, a second ILD layer 822 may be deposited and contacts (not shown) formed to the source/drain regions and gates for the NVM transistor and all of the MOS transistors. The second ILD layer 822 may include, for example, silicon oxide or silicon nitride, deposited or grown to a thickness of from about 0.5 μm to about 1 μm or other thicknesses, using any known CVD as described above. The contacts (not shown) may be formed by forming a patterned photoresist mask over second ILD layer 816, etching the second ILD layer 822 using any of the standard oxide etch processes as described above to stop on the silicide 812. Optionally, second ILD layer 822 may be a stress inducing layer or structure, such as a stress inducing nitride layer, over NVM transistor 226 to increase data retention and/or to improve programming time and efficiency. In particular, inducing stress into the charge-trapping layer 230 of the NVM transistor 226 changes energy levels of charge traps formed therein, thereby increasing charge retention of the charge-trapping layer. In addition, forming a stress inducing structure 822, in or on the surface 216 of the substrate 204 proximal to, and preferably surrounding, a region of the substrate in which the channel 224 of NVM transistor 226 is formed will reduce the band gap, and, depending on the type of strain, increases carrier mobility. For example, tensile strain, in which inter-atomic distances in the crystal lattice of the substrate 204 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 226.

The strain inducing structure 822 may include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-Tertiary Butyl Amino Silane (BTBAS) nitride layer.

In certain embodiments, such as that shown in FIG. 8J, the stress inducing structure 822 may also be formed over one or more of the MOS transistor (HV, I/O, or LV_MOS) to induce strain in the channel(s) 218 of the MOS transistor(s) 212, 214, 215.

FIG. 8J is a block diagram illustrating a cross-sectional view of a portion of a finished NVM device 800 including an embedded SONOS or MONOS based NVM transistor and MOS transistors fabricated according to the method of FIGS. 1 to 8I. As best illustrated in FIG. 8J, NVM device 800 includes one N-type NVM transistor 226, one N-type HV_MOS transistor 214, one N-type I/O_MOS transistor 215, and one P-type LV_MOS transistor. It will be the understanding that NVM device 800 may have multiple NVM transistors and MOS transistors of both P-type and N-type, and the illustrated figures are for illustrative purposes, and should not be interpreted as a limitation.

FIG. 8J illustrates a portion of the completed embedded SONOS or MONOS based NVM device 800 including one or more MONOS transistor or NVM transistor 226, HV_MOS transistor 214, I/O_MOS transistor 215, and LV_MOS transistor 212, all formed within a single semiconductor die or a single substrate 204. In one embodiment, multiple layer blocking dielectric (blocking oxide 260' and high-K dielectric layer 802) may include a thickness of from about 40 Å-45 Å. As previously described, the final thickness of blocking oxide 260' is achieved by the dual oxidation process in step 118 (illustrated in FIG. 2K), possibly by the subsequent LV gate oxide formation in step 122 (illustrated in FIG. 2J), and any subsequent cleaning processes. As discussed previously, high-K dielectric layer 802 may also add physical or electrical thickness to multiple layer blocking dielectric.

In one embodiment, HV_MOS 214 may require a relatively thick HV gate dielectric layer (HV gate oxide 252" plus high-K dielectric layer 802) that may have a combined thickness of from about 110 Å-160 Å. In one embodiment, the final thickness of HV gate oxide 252" may be achieved by the RTO or furnace oxidation process in step 114 (illustrated in FIG. 2H). Subsequently, the thickness of HV gate oxide 252" may be further enhanced possibly by dual oxidation process in step 118 (illustrated in FIG. 2K), and by the subsequent LV gate oxide formation in step 122 (illustrated in FIG. 2J), and modified by wet cleaning process(es). As discussed earlier, HV gate oxide 252" plus high-K dielectric layer 802 must be thick enough to withstand high operation voltages, especially during programming and erasing of NVM transistor 226, which may be in a range of 4.5 V-12 V. In one embodiment, I/O gate dielectric layer (I/O gate oxide 256' plus high-K dielectric layer 802) may include a thickness of about 30 Å-70 Å, to operate potentially of I/O voltages in a range of 1.6 V-3.6 V. As previously described, the final thickness of I/O gate oxide 256' is achieved by the dual oxidation process in step 118 (illustrated in FIG. 2K), and possibly by the subsequent LV gate oxide formation in step 122 (illustrated in FIG. 2J), and cleaning process(es). In one embodiment, LV gate dielectric layer (LV gate oxide 262 plus high-K dielectric layer 802) may have a combined thickness of from about 18 Å-26 Å for various operations in an operation range of 0.8 V-1.4 V. In one embodiment, high-K dielectric layer 802 may add physical or electrical thicknesses to multiple layer gate dielectric of MOS transistors 214, 215, and 212, respectively. In general, HV gate dielectric layer is thicker than I/O gate dielectric layer, and I/O gate dielectric layer is thicker than LV gate dielectric layer.

In one embodiment, nitrogen-rich oxide film (not shown in FIG. 8J) may also be formed in LV gate oxide 262, I/O gate oxide 256', HV gate oxide 252", and/or blocking dielectric 260' as they may be exposed to the "nitridizing atmosphere" during the LV gate oxide formation (step 122). The nitrogen-rich oxide film may be disposed close to substrate surface 216, or the bottom of blocking dielectric 260'.

In one embodiment, multilayer metal gates (first or second gate metal layer 818a or 818b and thick gate metal layer 820) may be included in some or all NVM transistors 226 and MOS transistors 212, 214, and 215. In some embodiments, at least one of NVM transistors 226 and MOS transistors 212, 214, and 215 may include a polysilicon gate instead. In one embodiment, polysilicon gates may be achieved when dummy polysilicon gates 804 are not etched out and replaced by multilayer metal gates.

Figure 9:
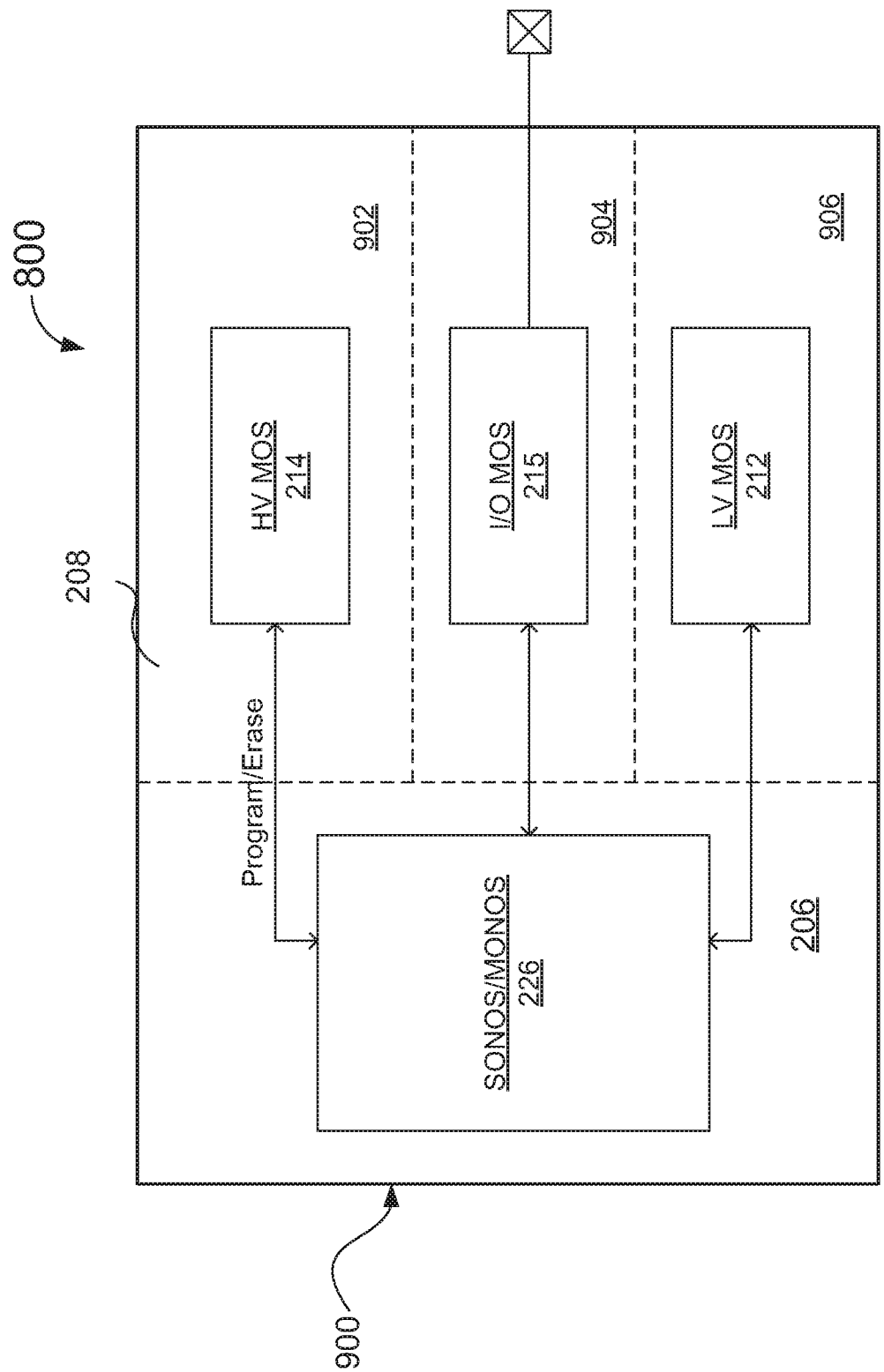
FIG. 9 is a representative block diagram illustrating one embodiment of embedded SONOS or MONOS based NVM device 800, as fabricated in FIGS. 2A-2L and 8A-8I.

FIG. 9 is a representative block diagram illustrating embedded SONOS or MONOS based NVM device 800, as fabricated in FIGS. 1 to 8I. In one embodiment, embedded SONOS or MONOS based NVM device 800 is formed in a single semiconductor die or substrate 900. The semiconductor die or substrate 900 is at least divided into the first region 206 for NVM transistors 226 and the second region 208 for MOS transistors 212, 214, 215. In some embodiments, there may be MOS transistors in the first region 206 as some NVM memory arrays may include regular MOS transistors. For example, a two-transistor (2T—memory gate/select gate) configuration memory array. The second region 208 may be further divided into HV_MOS area 902, I/O_MOS area 904, and LV_MOS area 906. In one embodiment, there may be system-on-chip (SOC) devices, such as microcontrollers, touch screen controllers, and smart cards, logic devices, microprocessor, other semiconductor based devices in the second region 208. It will be the understanding that embedded SONOS or MONOS based NVM device 800 may include other devices, such as processors, power circuits, etc. In various embodiments, the first and second regions 206 and 208 may be overlapping, and the HV_MOS area 902, I/O_MOS area 904, and LV_MOS area 906 may be overlapping. In will be the understanding that embodiment illustrated in FIG. 9 is only exemplary, and the first region 206 and the HV_MOS area 902, I/O_MOS area 904, and LV_MOS area 906 may be located in any area of single substrate 900, and may be made up of various different regions.

In one embodiment, HV_MOS 214 may be provided with a high voltage in a range of 4.5 V-12 V in order to program and/or erase NVM transistors in the first region. I/O_MOS may be coupled to I/O interface and provided with an operation voltage in a range of 1.6 V-3.6 V. LV_MOS 212 may be provided with an operation voltage in a range of 0.8 V-1.4 V for various operations and connections.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A semiconductor device comprising:
   a non-volatile memory (NVM) transistor including a SONOS or a MONOS type device having a tunnel dielectric layer, a charge-trapping layer and a blocking dielectric layer, wherein the blocking dielectric layer comprises a first high dielectric constant (high-K) dielectric layer disposed overlying a blocking oxide, a first gate electrode material in a first region of a semiconductor substrate, and a first vertical sidewall spacer that directly contacts the tunnel dielectric layer, the charge-trapping layer, and the blocking dielectric layer;
   a field-effect transistor (FET) of a first type including a first gate dielectric having a first thickness, a second gate electrode material in a second region of the semiconductor substrate, and a second vertical sidewall spacer that directly contacts the first gate dielectric and the second gate dielectric, wherein a gap between the first vertical sidewall spacer of the NVM transistor and the second vertical sidewall spacer of the FET separates the first region of the semiconductor substrate from the second region of the semiconductor substrate;
   a FET of a second type including a second gate dielectric having a second thickness and the second gate electrode material in the second region of the semiconductor substrate; and
   a FET of a third type including a third gate dielectric having a third thickness and the second gate electrode material in the second region of the semiconductor substrate;
   wherein each of first, second, and third gate dielectrics include the same material;
   wherein the first and the second gate electrode materials are different;
   wherein the first thickness and the second thickness are different than the third thickness;
   wherein the charge-trapping layer comprises a first charge-trapping layer that is oxygen-rich, a second charge-trapping layer disposed over the first charge-trapping layer that is silicon-rich and oxygen-lean relative to the first charge-trapping layer, wherein a thin oxide layer formed between the first and second charge-trapping layers; and
   wherein the first, second, and third gate dielectrics each comprise a second high-k dielectric layer, and the first and second high-K dielectric layers comprise the exact same material and the exact same thickness.

2. The semiconductor device of claim 1, wherein:
   the FET of the first type is a high voltage metal-oxide-semiconductor (HV_MOS) transistor;
   the FET of the second type is an input/output metal-oxide-semiconductor (1/0_MOS) transistor; and
   the FET of the third type is a low voltage metal-oxide-semiconductor (LV_MOS) transistor.

3. The semiconductor device of claim 1, wherein the first gate electrode material includes a multilayer metal gate disposed overlying the blocking dielectric of the NVM transistor, and wherein the multilayer metal gate includes a thick metal layer disposed over a thin metallic layer on the blocking dielectric layer.

4. The semiconductor device of claim 1, wherein the NVM transistor is disposed in the first region and the FETs of the first, second, and third types are disposed in the second region, and wherein the first and second regions are both disposed in one single semiconductor die.

5. The semiconductor device of claim 1, wherein the first, second, and third gate dielectric further includes respectively first, second, and third gate oxide disposed underneath the second high-K dielectric layer, and wherein the first gate oxide is thicker than the second gate oxide, the second gate oxide is thicker than the third gate oxide.

6. The semiconductor device of claim 1, wherein the NVM transistor is a metal-oxide-nitride-oxide-semiconductor (MONOS) transistor, wherein the MONOS transistor is of p-channel type, a gate metal layer therein includes high work function metal, wherein the high work function metal includes at least one of aluminum, titanium, tungsten and compounds or alloys thereof.

7. The semiconductor device of claim 1, wherein the NVM transistor is a metal-oxide-nitride-oxide-semiconductor (MONOS) transistor, wherein the MONOS transistor is of n-channel type, a gate metal layer therein includes high work function metal, wherein the high work function metal includes at least one of aluminum, titanium, tungsten and compounds or alloys thereof.

8. The semiconductor device of claim 2, wherein a first thickness of the first gate dielectric in the HV_MOS transistor is in an approximate range of 110 A to 160 A, and the HV_MOS transistor is configured to operate in a voltage range of 4.5 V to 12V for program or erase operations of the NVM transistor.

9. The semiconductor device of claim 1, wherein the second charge-trapping layer comprises a majority of charge traps in the charge-trapping layer.

10. The semiconductor device of claim 1, wherein the NVM transistor further comprises a polysilicon gate disposed overlying the blocking dielectric.

11. A memory device, comprising:
    a substrate disposed within a single semiconductor die;
    a plurality of non-volatile memory (NVM) transistors formed in a first region of the substrate, wherein at least one NVM transistor comprises a blocking dielectric including a first high dielectric constant (high-K) dielectric layer overlying a blocking oxide having a blocking oxide thickness and a first vertical sidewall spacer that directly contacts the blocking dielectric; and
    a plurality of metal-oxide-semiconductor (MOS) transistors formed in a second region of the substrate, wherein the plurality of MOS transistors include a high voltage (HV) MOS transistor, an input/output (I/O) MOS transistor, and a low voltage (LV) MOS transistor, a gate dielectric layer of the I/O MOS, and LV MOS transistors having distinctively different thicknesses from the HV MOS transistor, and each gate dielectric layer of the HV MOS, I/O MOS, and LV MOS transistors are with the same dielectric materials, wherein a gap between the first vertical sidewall spacer of the at least one NVM transistor and a second vertical sidewall spacer of a MOS transistor of the plurality of MOS transistors that directly contacts a first gate dielectric of the MOS transistor and a second gate dielectric of the MOS transistor separates the first region of the substrate from the second region of the substrate;

wherein the at least one NVM transistor comprises a charge-trapping layer, the charge-trapping layer comprising a first charge-trapping layer that is oxygen-rich and a second charge-trapping layer disposed over the first charge-trapping layer that is silicon-rich and oxygen-lean relative to the first charge-trapping layer, wherein a thin oxide layer formed between the first and second charge-trapping layers; and wherein each gate dielectric layer of the I/O MOS, LV MOS, and HV MOS transistors comprises a second high-K dielectric layer, and the first and second high-K dielectric layers comprise the exact same material and the exact same thickness.

12. The memory device of claim 11, wherein first gate metal layers of the HV MOS, I/O MOS, and LV MOS transistors include low work function metal, and wherein the HV MOS, I/O MOS, and LV MOS transistors are of n-channel type.

13. The memory device of claim 11, wherein first gate metal layers of the HV MOS, I/O MOS, and LV MOS transistors include high work function metal, and wherein the HV MOS, I/O MOS, and LV MOS transistors are of p-channel type.

14. The memory device of claim 11, wherein the at least one NVM transistor includes a metal layer disposed overlying a high-K dielectric layer, the metal layer including high work function metal and the at least one NVM transistor is of p-channel type.

15. The memory device of claim 11, wherein the at least one NVM transistor includes a gate metal layer disposed overlying a high-K dielectric layer, and wherein the metal layer include high work function metal and the at least one NVM transistor is of n-channel type.

16. A semiconductor system, comprising:
a system-on-chip (SOC) device;
a plurality of logic devices, wherein the SOC device and the plurality of logic devices are in a second region; and
an embedded non-volatile memory (NVM) device disposed within one single semiconductor die in a first region, wherein the embedded NVM comprises a first vertical sidewall spacer that directly contacts a tunnel dielectric layer, a charge-trapping layer, and a blocking dielectric layer of the embedded NVM, and a gap between the first vertical sidewall spacer of the NVM device and a second vertical sidewall spacer of one of the SOC device and the plurality of logic devices separates the first region of the semiconductor system from the second region of the semiconductor system, wherein the second vertical sidewall spacer directly contacts a first gate dielectric and a second gate dielectric one of the SOC device and the plurality of logic devices, and wherein:
the embedded NVM device includes a plurality of metal-oxide-nitride-oxide-semiconductor (MONOS) transistors, where at least one MONOS transistor includes a first metal gate layer overlying a blocking dielectric including a first high dielectric constant (high-K) dielectric layer disposed overlying a blocking oxide having a blocking oxide thickness; and the SOC device and the plurality of logic devices include high voltage (HV) metal-oxide-semiconductor (MOS) transistors, input/output (I/O) MOS transistors, and low voltage (LV) MOS transistors, wherein gate dielectric of each of the HV MOS, I/O MOS, and LV MOS transistors includes a second high-K dielectric layer, and wherein the gate dielectric of the HV MOS transistors are thicker than the gate dielectric of the I/O MOS transistors, and the gate dielectric of the I/O MOS transistors are thicker than the gate dielectric of the LV MOS transistors, wherein the gate dielectric of the LV MOS transistors include nitrided silicon oxide, and wherein a portion of the blocking oxide and a portion of the gate dielectric of the HV MOS transistors are formed simultaneously such that the blocking oxide thickness is corresponding to thickness of the gate dielectric of the HV MOS transistors;

wherein the embedded NVM device comprises the charge-trapping layer, the charge-trapping layer comprising a first charge-trapping layer that is oxygen-rich and a second charge-trapping layer disposed over the first charge-trapping layer that is silicon-rich and oxygen-lean relative to the first charge-trapping layer, wherein a thin oxide layer formed between the first and second charge-trapping layers; and wherein each gate dielectric layer of the I/O MOS, LV MOS, and HV MOS transistors comprises a second high-K dielectric layer, and the first and second high-K dielectric layers comprise the exact same material and the exact same thickness.

17. The semiconductor system of claim 16, wherein the at least one MONOS transistor is of n-channel type, and a first gate metal layer includes high work function metal.

18. The semiconductor system of claim 16, wherein:
the gate dielectric of the HV MOS transistors have a thickness in an approximate range of 110 A to 160 A, and the HV MOS transistors are configured to operate in an approximate range of 4.5 V-12 V for program/erase operations of the embedded NVM device; and
the gate dielectric of the I/O MOS transistors have a thickness in an approximate range of 30 A to 70 A, and are configured to operate in an approximate range of 1.6 V-3.6 v.

19. The semiconductor device of claim 1, wherein:
the FET of the first type is of n-channel type, a gate metal layer therein includes low work function metal;
the FET of the second type is of n-channel type, the gate metal layer therein includes low work function metal;
the FET of the third type is of n-channel type, the gate metal layer therein includes low work function metal; and
the low work function metal includes at least one of titanium, lanthanum, aluminum, and compounds or alloys thereof.

20. The semiconductor device of claim 1, wherein:
the FET of the first type is of p-channel type, a gate metal layer therein includes high work function metal;
the FET of the second type is of p-channel type, the gate metal layer therein includes high work function metal;

the FET of the third type is of p-channel type, the gate metal layer therein includes high work function metal; and the high work function metal includes at least one of aluminum, titanium, and compounds or alloys thereof.

21. The semiconductor device of claim 4, wherein:

the NVM transistor is a metal-oxide-nitride-oxide-semiconductor (MONOS) transistor, wherein the MONOS transistor is of n-channel type, a gate metal layer therein includes low work function metal, and wherein the low work function metal includes at least one of titanium, lanthanum, aluminum, and compounds or alloys thereof.

22. The memory device of claim 11, wherein at least one of the NVM transistors includes a metal layer disposed overlying a high-K dielectric layer, the metal layer including low work function metal and at least one of the NVM transistor is of n-channel type.

\* \* \* \* \*